United States Patent
Ito et al.

(10) Patent No.: US 9,177,838 B2
(45) Date of Patent: Nov. 3, 2015

(54) LIQUID PROCESS APPARATUS AND LIQUID PROCESS METHOD

(75) Inventors: Norihiro Ito, Koshi (JP); Kazuhiro Aiura, Koshi (JP); Naoki Shindo, Koshi (JP); Yosuke Hachiya, Koshi (JP); Takashi Nagai, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 704 days.

(21) Appl. No.: 13/546,394

(22) Filed: Jul. 11, 2012

(65) Prior Publication Data

US 2013/0014784 A1 Jan. 17, 2013

(30) Foreign Application Priority Data

Jul. 12, 2011 (JP) ................... 2011-154096
Jul. 12, 2011 (JP) ................... 2011-154111

(51) Int. Cl.
*B08B 3/00* (2006.01)
*H01L 21/67* (2006.01)
*G03F 7/42* (2006.01)

(52) U.S. Cl.
CPC .......... *H01L 21/67051* (2013.01); *G03F 7/423* (2013.01)

(58) Field of Classification Search
None
See application file for complete search history.

(56) References Cited

FOREIGN PATENT DOCUMENTS

JP     2007-035866 A1     2/2007

*Primary Examiner* — Eric Golightly
(74) *Attorney, Agent, or Firm* — Burr & Brown, PLLC

(57) ABSTRACT

A top plate 32 is provided to be moved in a horizontal direction between an advanced position, in which the top plate 32 covers from above a substrate W held by a substrate holding unit 21, and a retracted position that is retracted from the advanced position. An air hood 70 configured to supply a purified gas downward is provided to be lifted between a lower position, in which the air hood covers from above the substrate W held by the substrate holding unit 21, and an upper position located above the lower position.

13 Claims, 19 Drawing Sheets

LIQUID PROCESS APPARATUS AND LIQUID PROCESS METHOD

CROSS REFERENCE TO RELATED APPLICATIONS

This application is based upon and claims the benefit of priority from the prior Japanese Patent Application No. 2011-154111 filed on Jul. 12, 2011, and prior Japanese Patent Application No. 2011-154096 filed on Jul. 12, 2011, the entire contents of which are incorporated herein by reference.

FIELD OF THE INVENTION

The present invention relates to a liquid process apparatus and a liquid process method, each configured to perform a predetermined liquid process, such as a cleaning process, an etching process or the like, provided to a substrate, by supplying a process liquid to the substrate, with the substrate being horizontally held and rotated.

BACKGROUND ART

In a step for manufacturing semiconductor devices, a film to be processed is first formed on the substrate, such as a semiconductor wafer (that will be merely referred to as "the wafer") or the like, and then a resist film is formed, in a predetermined pattern, on the film to be processed. Thereafter, a process, such as the etching process, ion implantation or the like, is provided to the film to be processed, with the resist film being used as a mask. Then, after such a process is performed, the resist film that is no longer required is removed from the wafer.

As a method for removing the resist film, an SPM process is well known. This SPM process is performed by heating an SPM (Sulfuric Acid Hydrogen Peroxide Mixture) liquid that is obtained by mixing sulfuric acid with aqueous hydrogen peroxide, and then supplying the so-heated SPM liquid to the resist film.

Generally, in the SPM process, the SPM liquid heated to a high temperature is discharged toward the wafer. Therefore, in some cases, the SPM liquid is vaporized and thus fumes are generated. In such a case, the fumes are spread in a wide range in a chamber of a resist removing apparatus, thus leading to contamination of an inner wall of the chamber and parts provided in the chamber. Further, such fumes may cause contamination of the wafer. However, It should be noted that such a problem may also be caused by using any other chemical liquid than the SPM liquid.

In order to prevent the fumes from being spread in the wide range in the chamber and prevent the contamination of the inner wall of the chamber and the parts provided in the chamber, one resist removing apparatus is proposed in JP2007-35866. This resist removing apparatus includes a substrate holding unit configured to hold the wafer, a shielding wall provided for surrounding the wafer held by the substrate holding unit and having an opening positioned above the wafer, a cover located above the shielding wall, and a nozzle that is laterally inserted through a gap provided between the shielding wall and the cover and configured to discharge the SPM liquid toward the wafer. According to the resist removing apparatus disclosed in the JP2007-35866, the shielding wall and cover can respectively serve to prevent the fumes from being widely spread in the chamber.

SUMMARY OF THE INVENTION

However, in the resist removing apparatus disclosed in the above JP2007-35866, the cover may also be contaminated by the fumes. For instance, the fumes confined under the cover are condensed on and around the cover, and thus droplets of such fumes will be attached to the cover. In addition, the SPM liquid discharged toward the wafer is scattered, and thus a splash of such an SPM liquid will also be attached to the cover. In this case, upon a further process, such as a drying process or the like, that is performed after the SPM process, the droplets or splash attached to the cover may tend to be dropped down onto the wafer, as such leading to the contamination of the wafer.

The present invention was made in light of the above problem. Therefore, it is an object of this invention to provide the liquid process apparatus and liquid process method, each capable of preventing the fumes, once attached to the top plate upon the SPM process, from being attached to the substrate upon the further process, such as the drying process or the like, that is performed after the SPM process.

The liquid process apparatus of the present invention includes: a substrate holding unit configured to hold a substrate in a horizontal direction; a nozzle configured to supply a process liquid to the substrate held by the substrate holding unit; a cup located radially outside around the substrate when the substrate is held by the substrate holding unit, and configured to receive the process liquid supplied to the substrate by the nozzle; a top plate that moves in the horizontal direction between an advanced position, in which the top plate covers, from above, the substrate held by the substrate holding unit, and a retracted position, in which the top plate is retracted from the advanced position; and an air hood configured to supply a purified gas downward and move in the vertical direction between an air hood lower position, in which the air hood covers, from above, the substrate held by the substrate holding unit, and an upper position located above the lower position.

The liquid process method of the present invention includes: holding a substrate in a horizontal attitude; covering the held substrate with a top plate from above; performing a liquid process for the substrate by supplying a process liquid to the substrate, with the substrate being covered with the top plate from above; moving the top plate in a horizontal direction from an advanced position, in which the top plate covers the substrate from above, to a retracted position that is retracted from the advanced position; lowering the air hood configured to supply a purified gas downward, to cover the substrate with the air hood from above; and drying the substrate, with the purified gas being supplied downward from the air hood.

DETAILED DESCRIPTION OF THE INVENTION

First Embodiment

Figure 1:
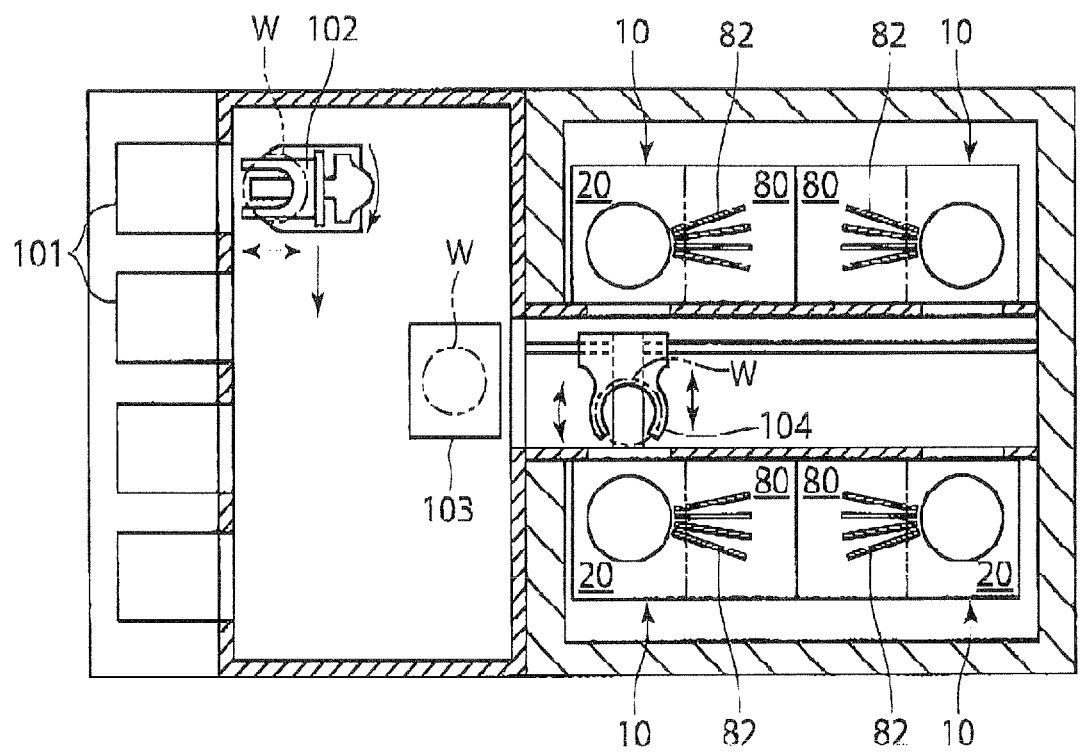
FIG. 1 is a top view of a liquid process system that is seen from above and includes a liquid process apparatus related to each embodiment of the present invention.
Figure 2:
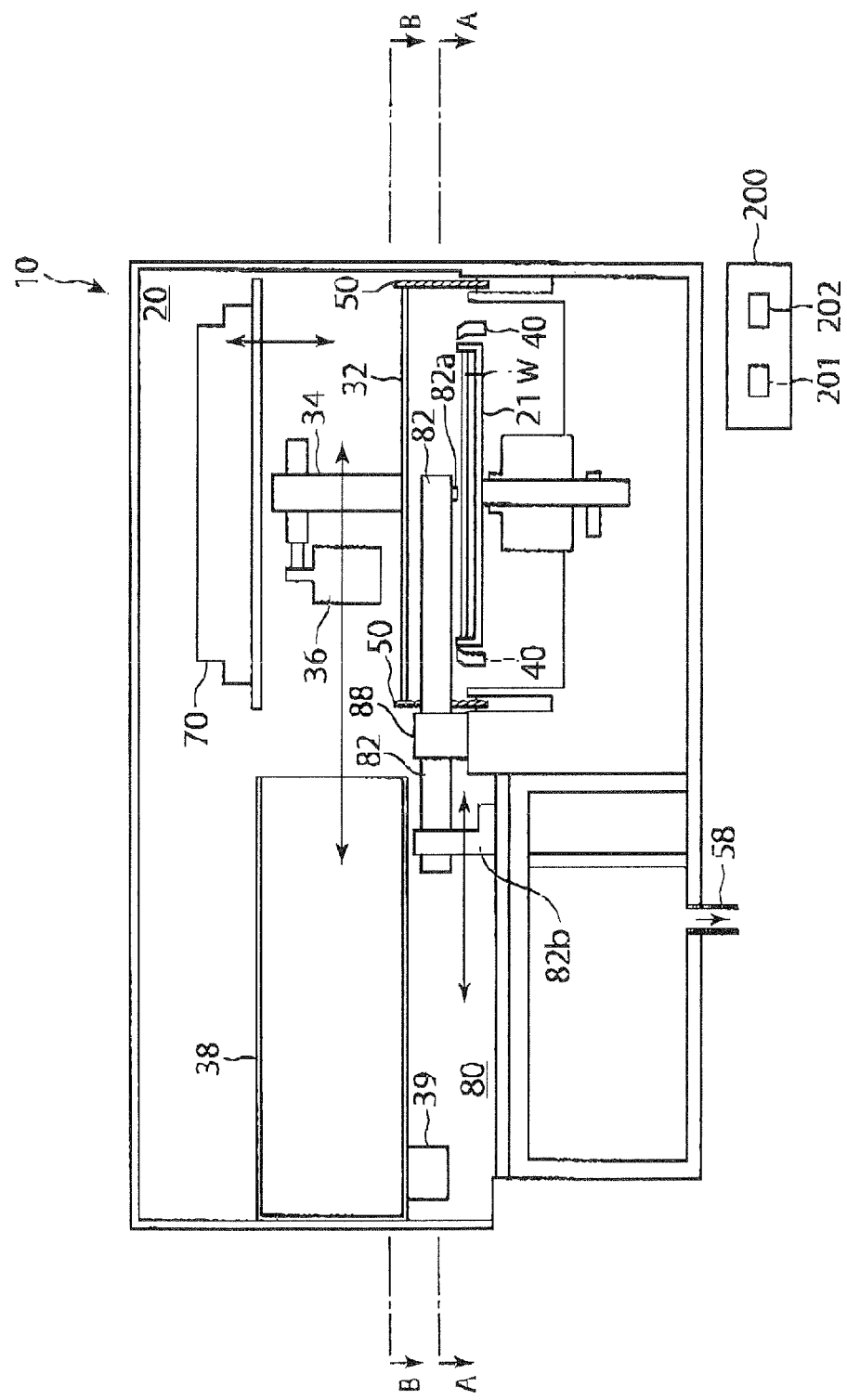
FIG. 2 is a side view of the liquid process apparatus related to a first embodiment of the present invention.
Figure 3:
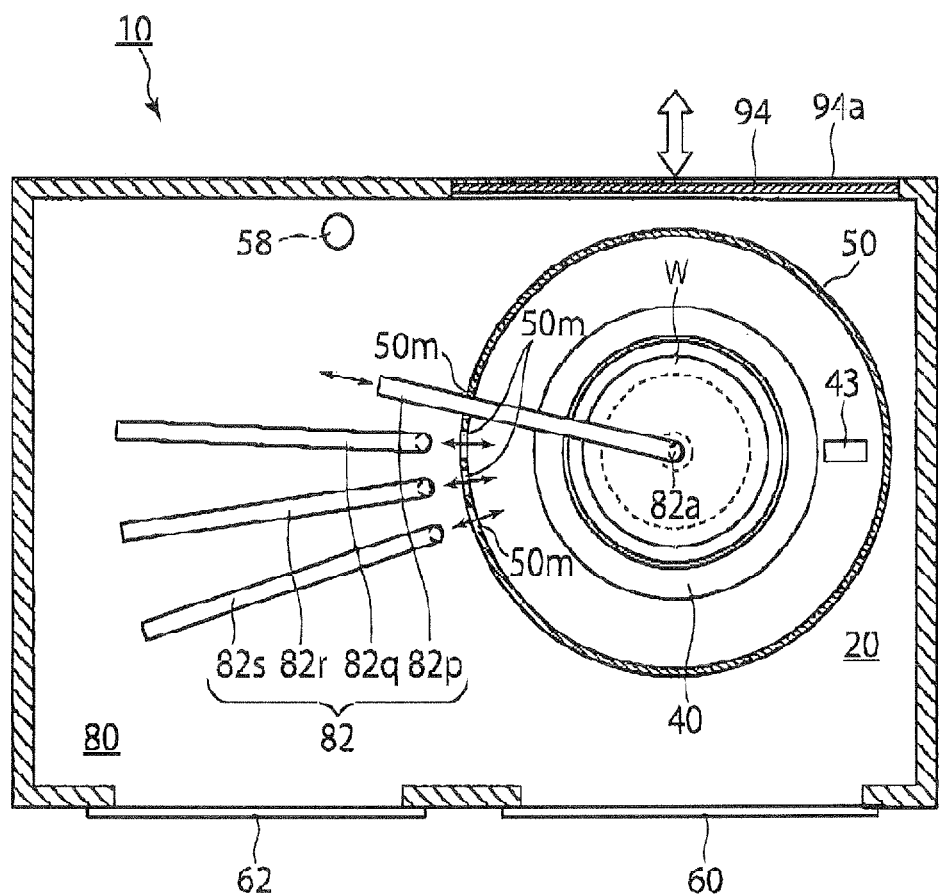
FIG. 3 is a top view of the liquid process apparatus when it is seen, at a point and in a direction, respectively expressed by an arrow A-A depicted in FIG. 2.
Figure 4:
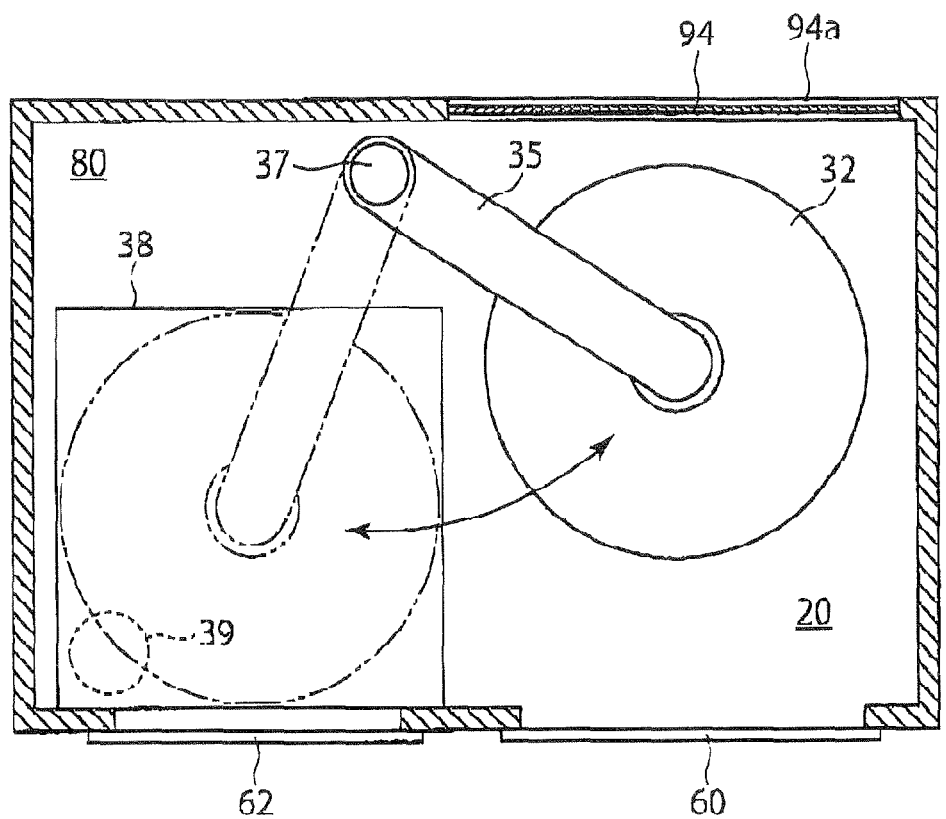
FIG. 4 is a top view of the liquid process apparatus when it is seen, at a point and in a direction, respectively expressed by an arrow B-B depicted in FIG. 2.
Figure 5:
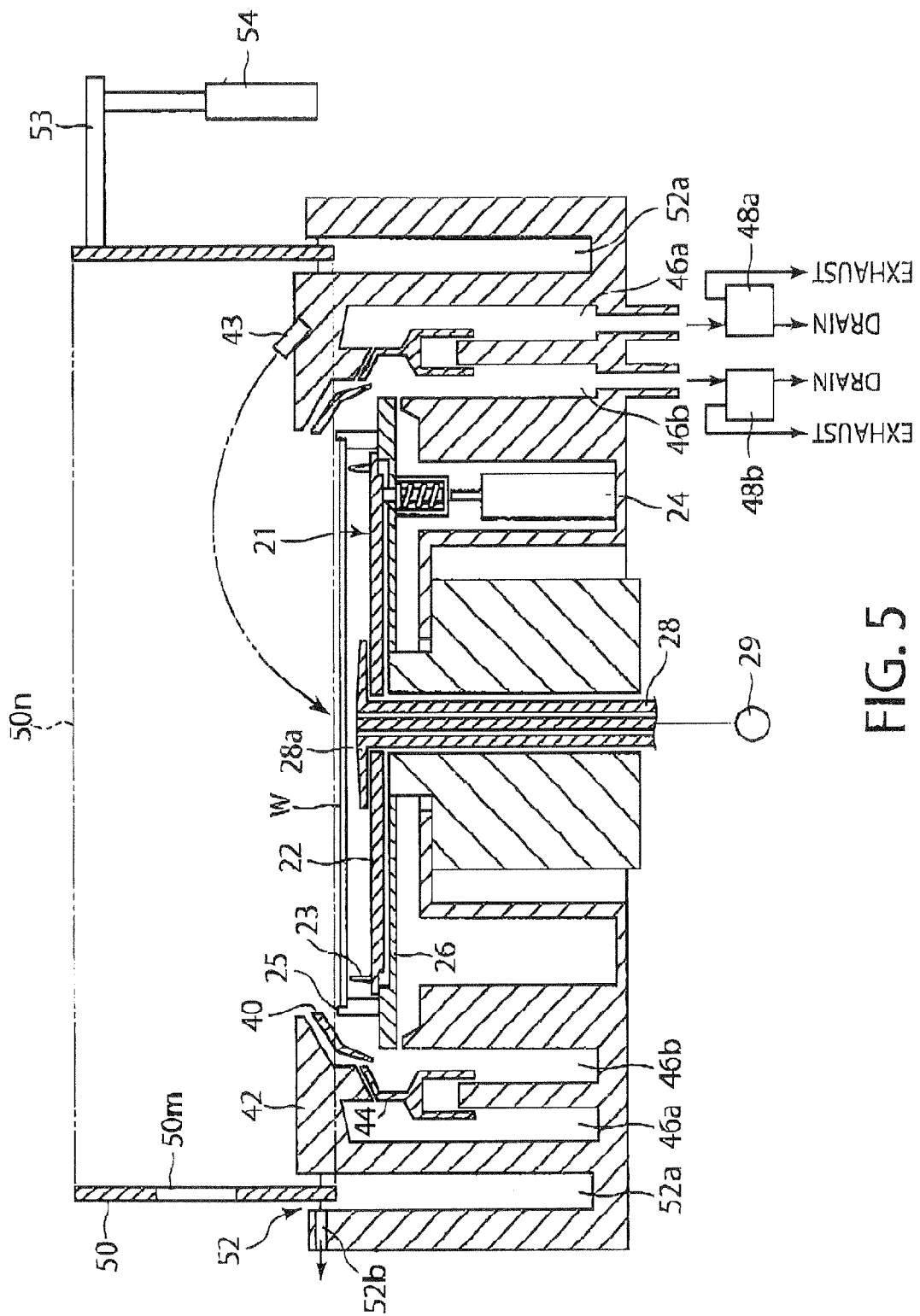
FIG. 5 is a longitudinal cross section for illustrating a substrate holding unit and the components, respectively located around the substrate holding unit in the liquid process apparatus shown in FIG. 2.
Figure 6:
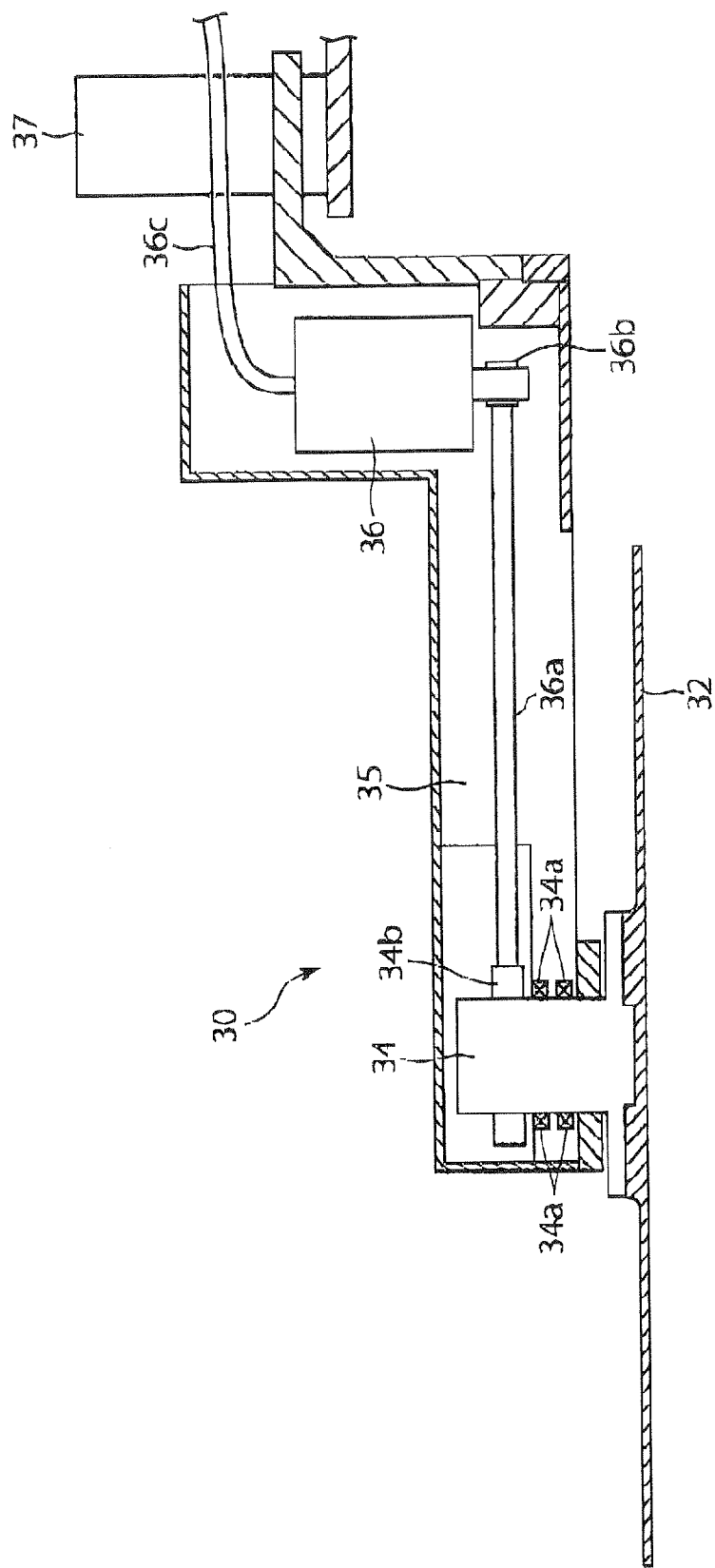
FIG. 6 is a longitudinal cross section for illustrating a top plate and the components, respectively located around the top plate in the liquid process apparatus shown in FIG. 2.
Figure 7:
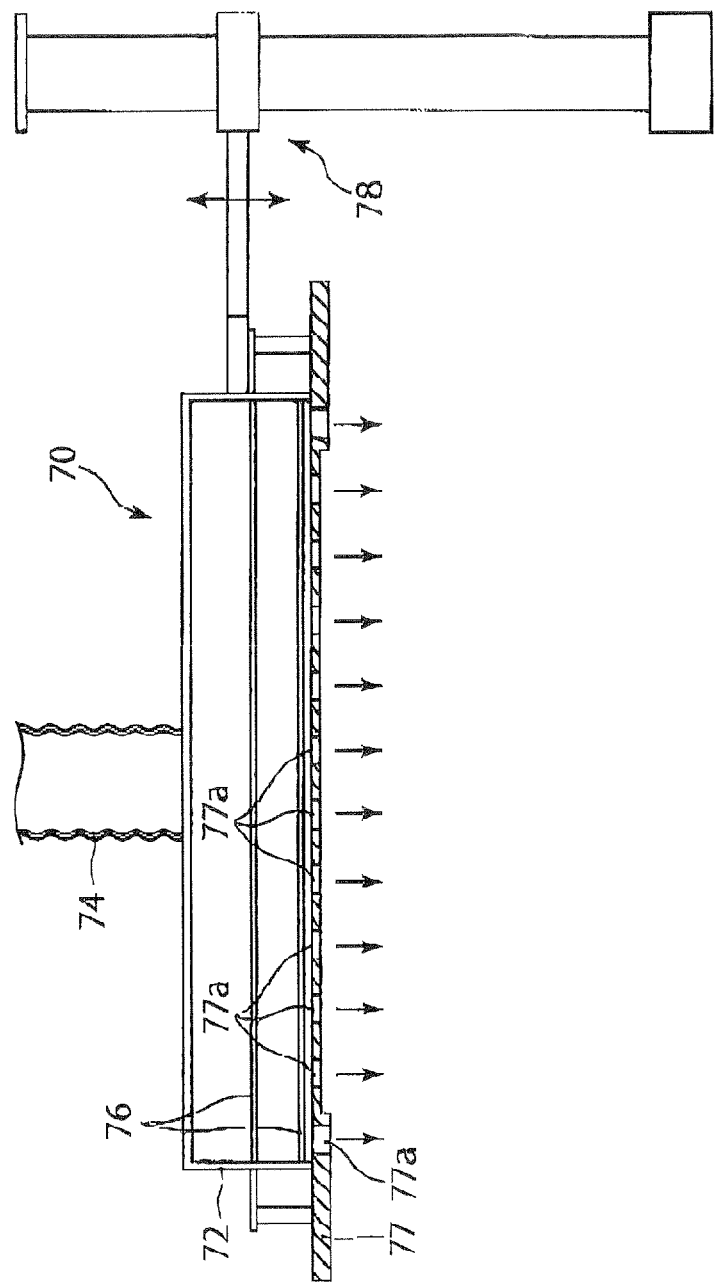
FIG. 7 is a longitudinal cross section for illustrating an air hood and the components, respectively located around an air hood in the liquid process apparatus shown in FIG. 2.
Figure 8:
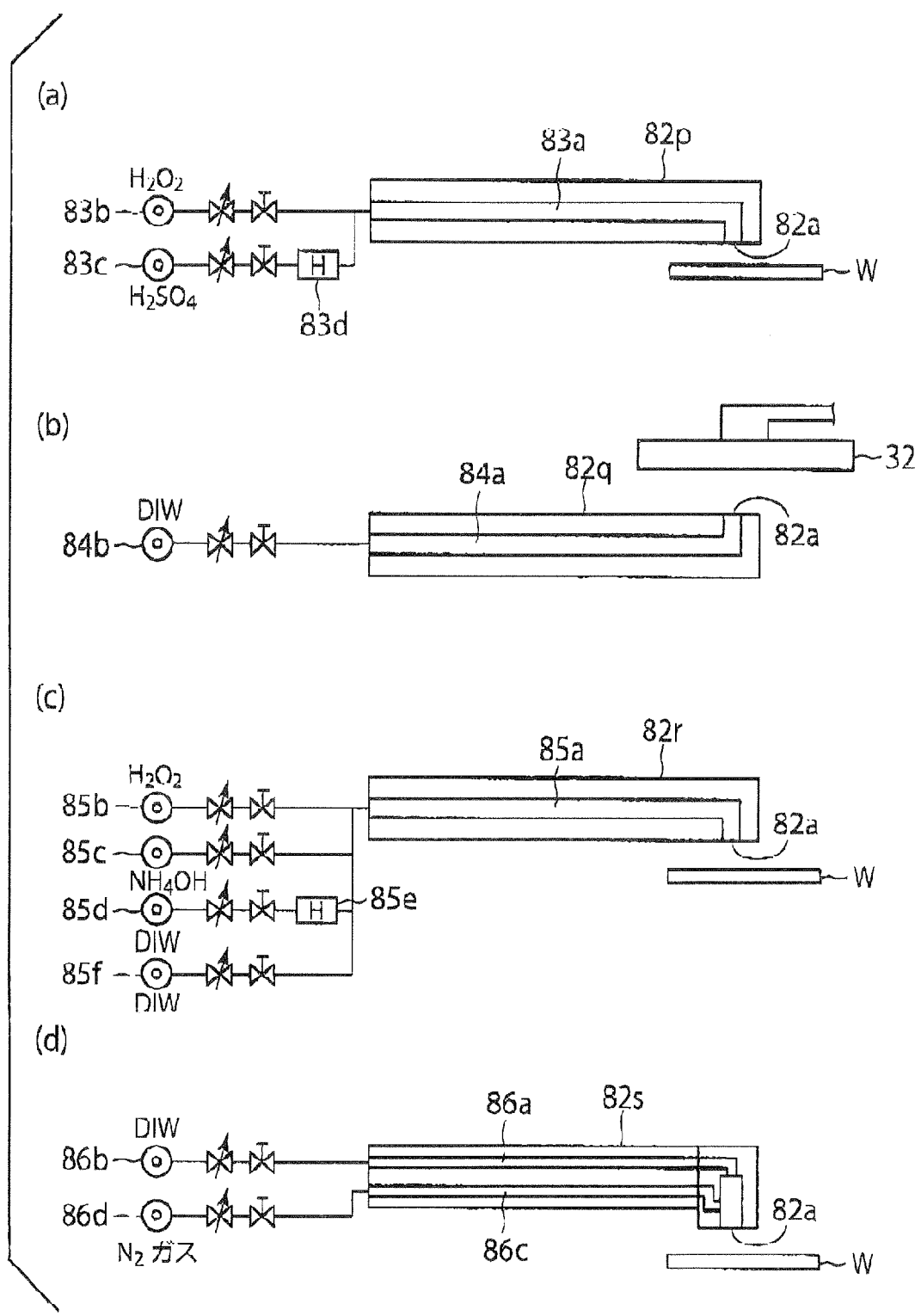
FIG. 8 is a diagram provided for illustrating each nozzle and each nozzle support arm respectively provided in the liquid process apparatus shown in FIG. 2.
Figure 9:
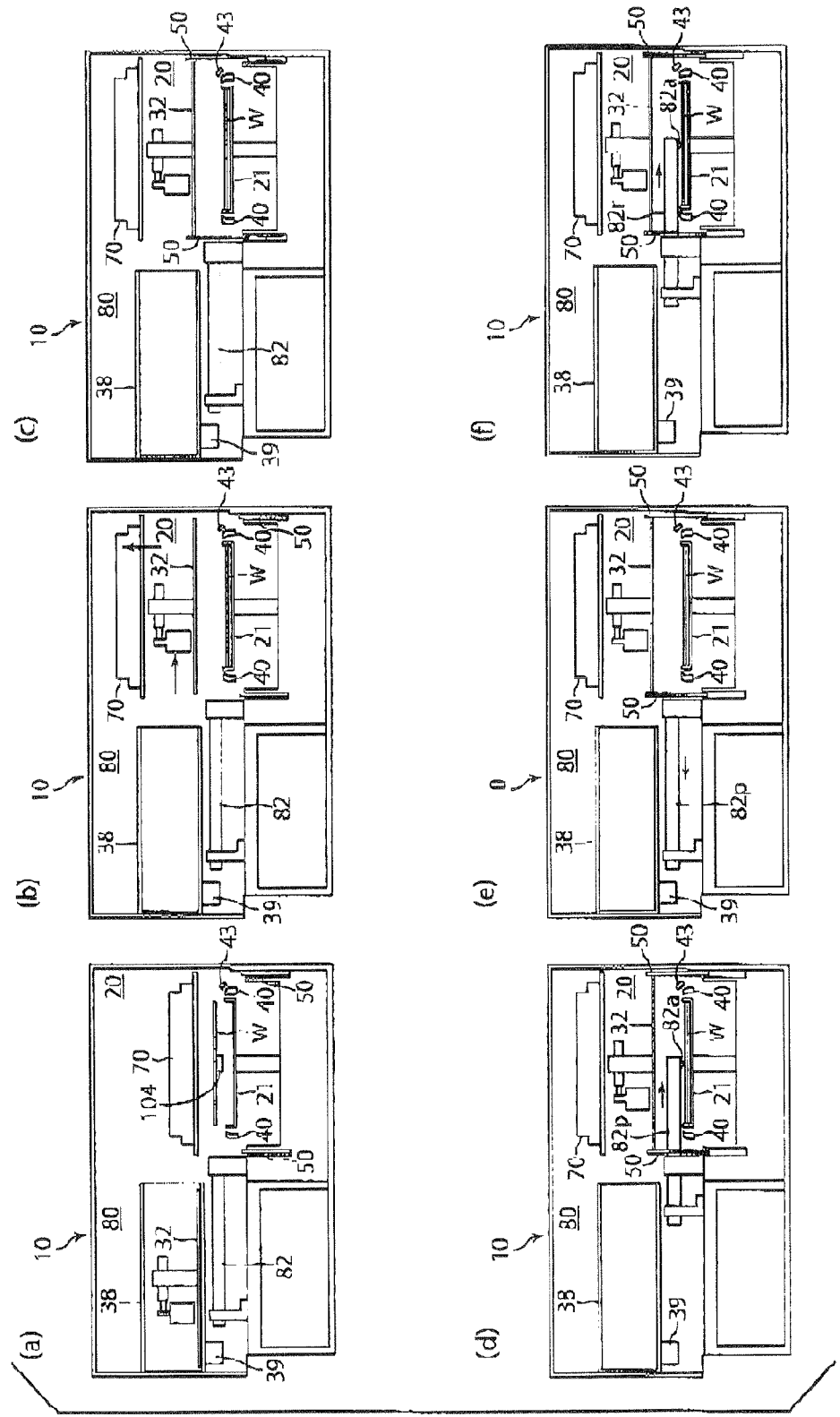
FIGS. 9(a) through 9(f) are diagrams respectively provided for successively illustrating a series of steps in the cleaning process for the wafer, respectively performed by the liquid process apparatus shown in FIG. 2.
Figure 10:
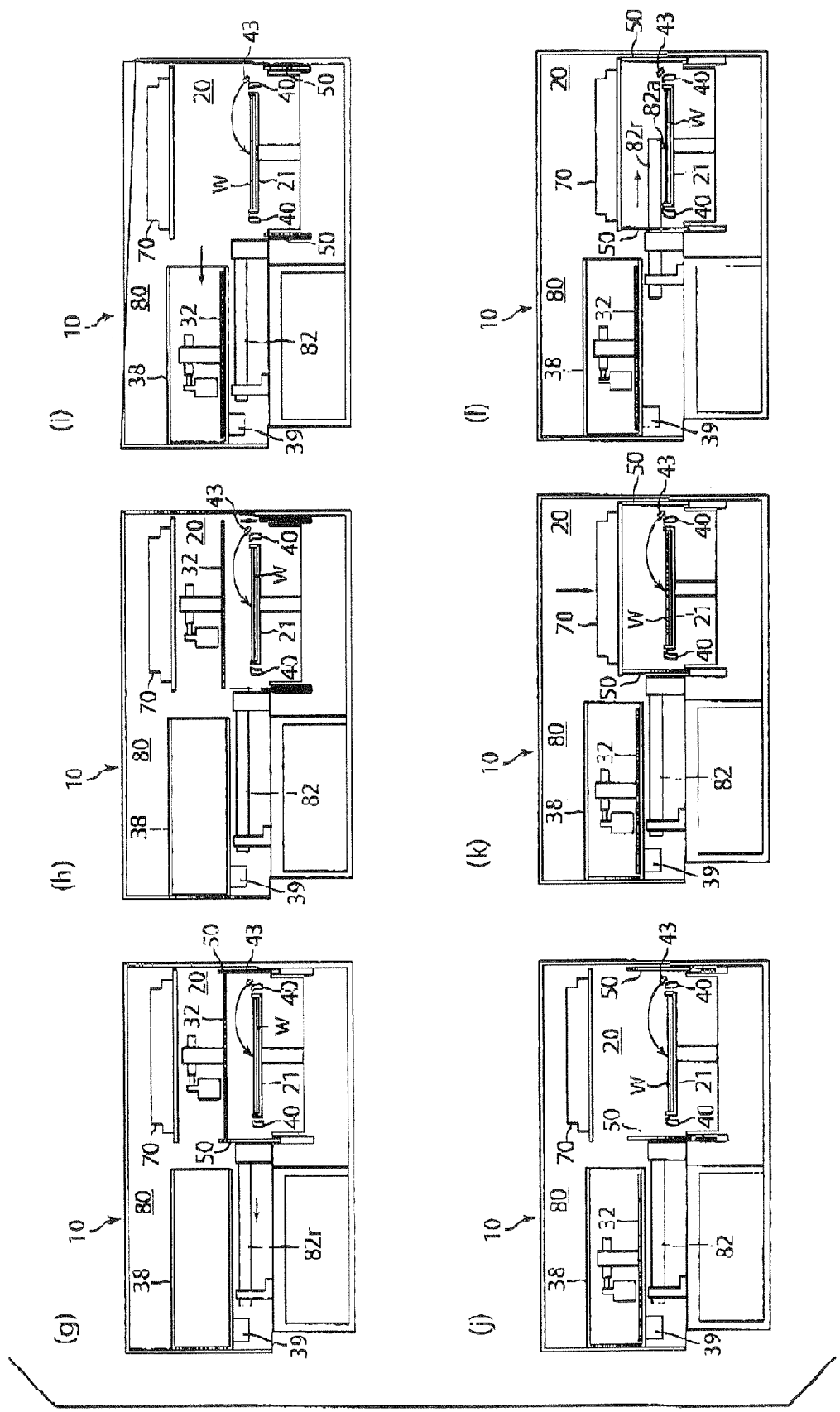
FIGS. 10(g) through 10(l) are diagrams respectively provided for successively illustrating a further series of steps in the cleaning process for the wafer, respectively performed by the liquid process apparatus shown in FIG. 2.
Figure 11:
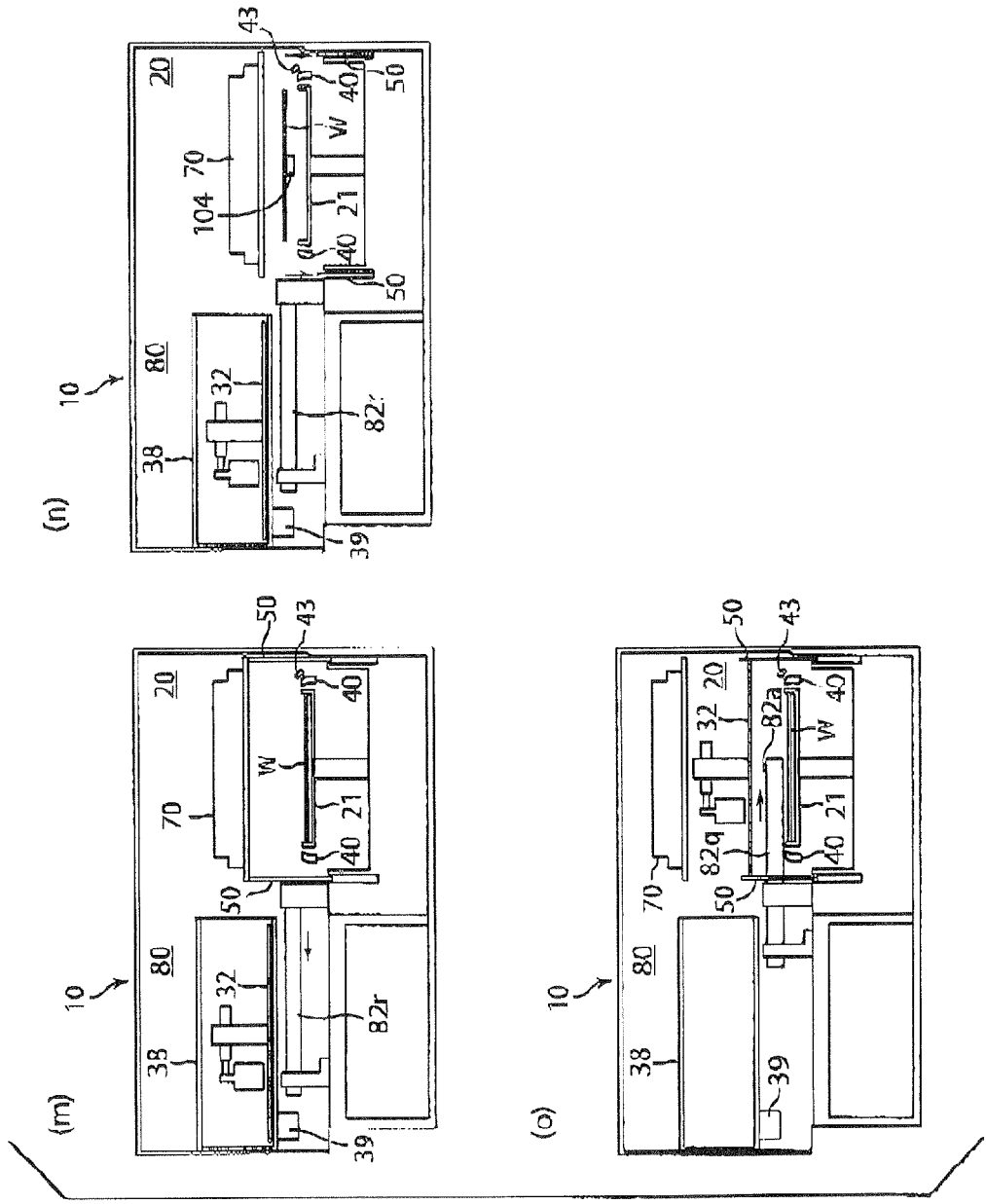
FIGS. 11(m) through 11(o) are diagrams respectively provided for successively illustrating a still further series of steps in the cleaning process for the wafer, respectively performed by the liquid process apparatus shown in FIG. 2.

Hereinafter, the first embodiment of the present invention will be described with reference to the drawings. FIGS. 1 through 11 are provided for respectively illustrating the liquid process apparatus related to the first embodiment. More specifically, FIG. 1 shows one exemplary top view of the liquid process system including the liquid process apparatus related to each embodiment of the present invention. FIG. 2 shows one exemplary side view of the liquid process apparatus related to the first embodiment of the present invention. FIG. 3 shows one top view of the liquid process apparatus when it is seen, at the point and in the direction, respectively expressed by the arrow A-A depicted in FIG. 2, and FIG. 4 shows another top view of the liquid process apparatus when it is seen, at the point and in the direction, respectively expressed by the arrow B-B depicted in FIG. 2. FIG. 5 is one exemplary longitudinal cross section for illustrating the substrate holding unit and the components, respectively located around the substrate holding unit of the liquid process apparatus shown in FIG. 2. FIG. 6 is one exemplary longitudinal cross section for illustrating the top plate and the components, respectively located around the top plate of the liquid process apparatus shown in FIG. 2. FIG. 7 is one exemplary longitudinal cross section for illustrating the air hood and the components, respectively located around the air hood of the liquid process apparatus shown in FIG. 2. FIG. 8 is provided for illustrating each nozzle and each nozzle support arm respectively provided in the liquid process apparatus shown in FIG. 2. FIGS. 9 through 11 are respectively provided for successively illustrating one series of steps in the cleaning process for the wafer, respectively performed by the liquid process apparatus shown in FIG. 2.

Now referring to FIG. 1, the liquid process system including the liquid process apparatus related to this embodiment will be described. As shown in FIG. 1, the liquid process system includes tables 101, each configured to place thereon a carrier containing the substrates W (also referred to as the wafers W), such as the semiconductor wafers or the like, each supplied to be processed from the exterior, a transfer arm 102 configured to take out each wafer W contained in the carrier, a rack unit 103 configured to place thereon the wafer W taken out by the transfer arm 102, and another transfer arm 104 configured to receive the wafer W placed on the rack unit 103 and then carrying the wafer W into each liquid process apparatus 10. As shown in FIG. 1, this liquid process system includes a plurality of (e.g., four in this embodiment shown in FIG. 1) liquid process apparatuses 10.

Next, referring to FIGS. 2 to 4, general construction of each liquid process apparatus 10 related to this embodiment will be described.

As shown in FIGS. 2 to 4, each liquid process apparatus 10 related to this embodiment includes a processing chamber 20 configured to contain therein the wafer W such that this wafer W can be subjected to the liquid process, as well as includes an arm standby chamber 80 located in a position adjacent to the processing chamber 20. In the liquid process apparatus 10 related to this embodiment, there is no partition wall for separating the processing chamber 20 from the arm standby chamber 80. Namely, this processing chamber 20 is in communication with the arm standby chamber 80. Further, as shown in FIG. 2, a substrate holding unit 21 is provided in the processing chamber 20. This substrate holding unit 21 is configured to horizontally hold and rotate the wafer W, A ring-like rotation cup 40 is arranged around the substrate holding unit 21. Upon the liquid process performed for the wafer W, the rotation cup 40 can serve to receive the process liquid after this process liquid is supplied to the wafer W. Further, as shown in FIGS. 2 and 3, an outside cup peripheral case 50 is arranged around the rotation cup 40 in the processing chamber 20. As will be described later, the outside cup peripheral case 50 is provided to move, depending on the condition of each process provided to the wafer W. It is noted that the construction of each of the substrate holding unit 21, rotation cup 40 and outside cup peripheral case 50 will be detailed later.

Additionally, as shown in FIG. 2, the liquid process apparatus 10 includes a nozzle (or reciprocating nozzle) 82a configured to supply the process liquid, from above, to the wafer W held by the substrate holding unit 21, and a nozzle support arm 82 configured to support the nozzle 82a. As shown in FIG. 3, a plurality of (e.g., four) nozzle support arms 82 are provided to one liquid process apparatus 10, and each nozzle support arm 82 has one nozzle 82a provided at a distal end thereof. Further, as shown in FIG. 2, an arm support unit 82b is provided to each nozzle support arm 82. Each arm support unit 82b is designed to be driven, left and right in FIG. 2, by a drive mechanism (not shown). With this configuration, each nozzle support arm 82 can be moved linearly in the horizontal direction between an advanced position, in which the arm 82 is advanced into the outside cup peripheral case 50 via a side opening 50m, and a retracted position, in which the arm is retracted from the outside cup peripheral case 50 (see arrows respectively depicted for each nozzle support arm 82 shown in FIGS. 2 and 3).

Additionally, as shown in FIGS. 2 and 4, a top plate 32 configured to cover, from above, the wafer W held by the substrate holding unit 21 is provided to be moved in the horizontal direction. More specifically, the top plate 32 can be reciprocated between an advanced position as shown by a solid line depicted in FIG. 4, in which the plate 32 covers, from above, the wafer W held by the substrate holding unit 21, and a retracted position as shown by a two-dot chain line depicted in FIG. 4, in which the plate 32 is retracted in the horizontal direction from the advanced position. It is noted that the construction of the top plate 32 will be detailed later.

Further, as shown in FIG. 2, an air hood 70 configured to cover, from above, the wafer W held by the substrate holding unit 21 is provided to move. This air hood 70 is designed for allowing a purified gas, such as N2 gas (nitrogen gas), clean air or the like, to be flowed downward therefrom. More specifically, the air hood 70 is provided to move between a lower position, in which the hood 70 covers, from above, the wafer W held by the substrate holding unit 21, and an upper position located above the lower position. FIG. 2 shows the air hood 70 located in the upper position. It is noted that the construction of the air hood 70 will be detailed later.

As shown in FIGS. 2 and 3, an exhaust unit 58 is provided to the bottom of the arm standby chamber 80 located outside relative to the outside cup peripheral case 50. This exhaust unit 58 can serve to discharge the atmosphere in the arm standby chamber 80. More specifically, the exhaust unit 58 can draw out unwanted particles generated from the drive mechanism (not shown) for driving each nozzle support arm 82.

Further, as shown in FIGS. 3 and 4, shutters 60, 62 are respectively provided to openings respectively used for maintenance for the processing chamber 20 and arm standby chamber 80 in the liquid process apparatus 10. The provision of such shutters 60, 62 for the maintenance for the processing chamber 20 and arm standby chamber 80 can allow the equipment provided in the processing chamber 20 and/or arm standby chamber 60 to be maintained individually.

Additionally, as shown in FIG. 3, an opening 94a is provided to a side wall of the liquid process apparatus 10. This opening 94a is designed to allow the wafer W to be carried into the processing chamber 20, or carried out from the processing chamber 20, by the transfer arm 104. To the opening 94a, another shutter 94 configured to open and close the opening 94a is provided.

Now referring to FIGS. 5 through 8, each component of the liquid process apparatus 10 as shown in FIGS. 2 to 4 will be detailed.

First, referring to FIG. 5, the substrate holding unit 21 is described. FIG. 5 shows one longitudinal cross section for illustrating the substrate holding unit 21 and the components, respectively located around the substrate holding unit 21, among the components respectively provided in the liquid process apparatus 10.

As shown in FIG. 5, the substrate holding unit 21 includes a disk-like holding plate 26 configured to hold the wafer W, and a disk-like lift pin plate 22 located above the holding plate 26. On the top surface of the lift pin plate 22, three lift pins 23, each configured to support the wafer W from below, are provided, with an equal interval, in the circumferential direction. It is noted that FIG. 5 shows only two of such lift pins 23. A piston mechanism 24 is provided below the lift pin plate 22. This piston mechanism 24 can serve to lift the lift pin plate 22. More specifically, when the wafer W is placed on the lift pins 23 by the transfer arm 104 (see FIG. 1) or when the wafer W is taken out from a place over the lift pins 23 by the transfer arm 104, the lift pin plate 22 is moved upward, from one position as shown in FIG. 5 to another position located above the rotation cup 40, by the piston mechanism 24. Meanwhile, when the liquid process, drying process or the like for the wafer W is performed in the processing chamber 20, the lift pin plate 22 is moved to a lower position (i.e., the position as shown in FIG. 5) by the piston mechanism 24. As a result, the rotation cup 40 is arranged around the wafer W.

To the holding plate 26, three holding members 25, each configured to laterally hold the wafer W, are provided, with an equal space, in the circumferential direction. It is noted that FIG. 2 shows only two of such holding members 25. In this case, each holding member 25 can serve to laterally support the wafer W placed on the lift pins 23 when the lift pin plate 22 is moved to the lower position as shown in FIG. 5 from the upper position, in order to separate the wafer W slightly from the lift pins 23.

A central part of each of the lift pin plate 22 and holding plate 26 has a through-hole formed therein, and a process liquid supply pipe 28 is provided to extend through the through-hole. The process liquid supply pipe 28 is configured to supply various process liquids, such as the chemical liquids, pure water and the like, to the back surface of the wafer W held by each holding member 25 of the holding plate 26. Further, this process liquid supply pipe 28 is designed to move together with the lift pin plate 22. At an upper end of the process liquid supply pipe 28, a head part 28a is provided to close the through-hole of the lift pin plate 22. Additionally, as shown in FIG. 5, a process liquid supply unit 29 is connected with the process liquid supply pipe 28, such that various process liquids can be supplied to the process liquid supply pipe 28 by the process liquid supply unit 29.

The ring-like rotation cup 40 is attached to the holding plate 26. As such, the rotation cup 40 is rotated integrally with the holding plate 26, via a connection part (not shown). Further, as shown in FIG. 5, the rotation cup 40 is designed to laterally surround the wafer W supported by each holding member 25 of the holding plate 26. Thus, the rotation cup 40 can serve to receive the process liquid laterally scattered out from the wafer W upon the liquid process for the wafer W.

Further, a drain cup 42 and a guide cup 44 are provided, respectively, around the rotation cup 40. Each of the drain cup 42 and guide cup 44 is formed into a ring-like shape. In addition, each of the drain cup 42 and guide cup 44 has an opening formed in the top thereof. In this case, the drain cup is fixed in position in the processing chamber 20. Meanwhile, the guide cup 44 is connected with a transfer cylinder (not shown), such that the guide cup 44 can move by the transfer cylinder.

As shown in FIG. 5, a first discharge unit 46a and a second discharge unit 46b are provided, respectively, below the drain cup 42 and/or guide cup 44. Depending on the position in the vertical direction of the guide cup 44, the process liquid laterally scattered out from the wafer W upon the liquid process for the wafer W is selectively fed to either one of the two discharge units 46a, 46b, based on the kind of the process liquid. More specifically, when the guide cup 44 is located in an upper position (i.e., the position as shown in FIG. 5), a predetermined process liquid (e.g., an SC-1 liquid that will be described later) laterally scattered from the wafer W is fed to the second discharge unit 46b. Meanwhile, when the guide cup 44 is located in a lower position, another predetermined process liquid (e.g., the SPM liquid that will be described later) laterally scattered from the wafer W is fed to the first discharge unit 46a. Further, as shown in FIG. 5, gas-liquid separators 48a, 48b are respectively connected with the first discharge unit 46a and second discharge unit 46b. In this case, each of the first and second discharge units 46a, 46b is provided for performing not only a drain process but also an exhaust process. Namely, in each of the gas-liquid separators 48a, 48b, as shown in FIG. 5, the process liquid and gas, respectively fed from each of the first discharge unit 46a and second discharge unit 46b, are separated from each other, such that the drain process and exhaust process can be performed, respectively.

Again, as shown in FIG. 5, a fixed rinse nozzle 43 configured to supply the pure water toward the center of the wafer W is provided to the drain cup 42. With the provision of this fixed rinse nozzle 43, a rinse liquid, such as the pure water or the like, can be discharged, in a parabolic line (as shown by a two-dot chain line depicted in FIG. 5), toward the center of the wafer W.

Further, in the liquid process apparatus 10 of this embodiment, the outside cup peripheral case 50 is provided around the drain cup 42 and/or guide cup 44 in the processing chamber 20. As shown in FIG. 5, a support member 53 configured to support the outside cup peripheral case 50 is connected with the top of the outside cup peripheral case 50, and a proper drive mechanism 54 for moving the support member 53 is provided to the support member 53. As such, by moving the support member 53 by using the drive mechanism 54, the outside cup peripheral case 50 can move between the upper position as shown in FIG. 5, in which the top end of the outside cup peripheral case 50 is positioned above the rotation cup 40, and the lower position located below the upper position. Additionally, as shown in FIGS. 3 and 5, the side opening 50m is formed in the side surface of the outside cup peripheral case 50. This side opening 50m is provided for allowing each nozzle support arm 82 to pass therethrough. Further, as shown in FIG. 5, a top opening 50n is provided to the top of the outside cup peripheral case 50. This top opening sun is designed to be closed by the top plate 32 when the outside cup peripheral case 50 is located in the upper position and the top plate 32 is located in the advanced position.

In addition, as shown in FIG. 5, a cleaning unit 52 configured to clean the outside cup peripheral case 50 is provided in the processing chamber 20. The cleaning unit 52 has an accumulation section 52a configured to accumulate therein a cleaning liquid, such as the pure water or the like. With this configuration, when the outside cup peripheral case 50 is located in the lower position, the outside cup peripheral case is clipped in the cleaning liquid accumulated in the accumulation section 52a. Namely, the cleaning unit 52 is designed to clean the outside cup peripheral case 50, by allowing the outside cup peripheral case 50 to be dipped in the cleaning liquid accumulated in the accumulation section 52a.

A cleaning liquid supply pipe (not shown) is connected with the accumulation section 52a, such that the cleaning liquid can be successively fed to the accumulation section 52a via the cleaning liquid supply pipe. Additionally, a drain pipe 52b is provided to a side part of the accumulation section 52a, such that the cleaning liquid accumulated in the accumulation section 52a can be drained or discharged via the drain pipe 52b. Namely, by allowing the cleaning liquid to be successively fed to the accumulation section 52a via the cleaning liquid supply pipe as well as by allowing the cleaning liquid accumulated in the accumulation section 52a to be discharged via the drain pipe 52b, the cleaning liquid accumulated in the accumulation section 52a can be purified.

Now, returning to FIG. 2, an arm cleaning unit 88 is provided in the liquid process apparatus 10. This arm cleaning unit 86 is designed to clean each nozzle support arm 82. More specifically, the arm cleaning unit 88 is fixed in position, and has a container section (not shown) configured to contain the cleaning liquid. With this configuration, when one nozzle support arm 82 is moved from the advanced position to the retracted position or moved from the retracted position to the advanced position, this nozzle support arm 82 is moved, with one part of the arm 82 being in contact with the cleaning liquid contained in the container section. In this way, the cleaning process for each nozzle support arm 82 can be performed.

Next, referring to FIG. 8, the liquid or fluid that is discharged from each nozzle 82a of the four nozzle support arms 82 (82p to 82s) will be described in more detail.

As shown in FIG. 8(a), the nozzle 82a of a first nozzle support arm 82p of the four nozzle support arms 82 is provided to face downward, such that the SPM liquid obtained by mixing the sulfuric acid with the aqueous hydrogen peroxide can be discharged downward toward the wafer W from the nozzle 82a of the first nozzle support arm 82p. More specifically, in the first nozzle support arm 82p, one process liquid supply pipe 83a connected with the nozzle 82a is provided, and an aqueous hydrogen peroxide supply unit 83b and a sulfuric acid supply unit 83c, which are arranged in parallel with each other, are respectively connected with the process liquid supply pipe 83a, via respective flow control valves and open-and-close valves. Further, a heater 83d configured to heat the sulfuric acid supplied from the sulfuric acid supply unit 83c is provided. With this configuration, the aqueous hydrogen peroxide and sulfuric acid, respectively supplied from the aqueous hydrogen peroxide supply unit 83b and sulfuric acid supply unit 83c, are mixed together, and then the SPM liquid obtained by mixing the sulfuric acid with the aqueous hydrogen peroxide will be fed to the nozzle 82a of the first nozzle support arm 82p via the process liquid supply pipe 83a. Further, in this case, due to a heating process performed by the heater 83d for heating the sulfuric acid supplied from the sulfuric acid supply unit 83c as well as due to a chemical reaction caused by mixing of the sulfuric acid with the aqueous hydrogen peroxide, some heat of reaction is generated. Therefore, with this heat of reaction, the SPM liquid discharged from the nozzle 82a of the first nozzle support arm 82p will be heated to a relatively high temperature, e.g., 100° C. or higher, more preferably about 170° C.

Further, as shown in FIG. 8(b), the nozzle 82a of a second nozzle support arm 82q of the four nozzle support arms 82 is provided to face upward, such that a top plate cleaning liquid, such as the pure water or the like, for cleaning the top plate 32 can be discharged upward from the nozzle 82a of the second nozzle support arm 82q. More specifically, in the second nozzle support arm 82q, a top plate cleaning liquid supply pipe 84a connected with the nozzle 82a is provided, and a top plate cleaning liquid supply unit 84b is connected with the top plate liquid supply pipe 84a, via the flow control valve and open-and-close valve. With this configuration, the top plate cleaning liquid, such as the pure water or the like, supplied from the top plate cleaning liquid supply unit 84b can be fed to the nozzle 82a of the second nozzle support arm 82q via the top plate cleaning liquid supply pipe 84a.

Further, as shown in FIG. 8(c), the nozzle 82a of a third nozzle support arm 82r of the four nozzle support arms 82 is provided to face downward, such that a mixture (also referred to as "the SC-1 liquid") of aqueous ammonia and aqueous hydrogen peroxide and/or heated pure water can be discharged downward toward the wafer W from the nozzle 82a of the third nozzle support arm 82r. More specifically, in the third nozzle support arm 82r, another process liquid supply pipe 85a connected with the nozzle 82a is provided, and another aqueous hydrogen peroxide supply unit 85b, an aqueous ammonia supply unit 85c, two pure water supply units 85d and 85f, which are arranged in parallel with one another, are respectively connected with the process liquid supply pipe 85a, via the respective flow control valves and open-and-close valves. Further, another heater 85e configured to heat the pure water supplied from the pure water supply unit 85d is provided. For instance, in the state in which the open-and-close valves, respectively corresponding to the pure water supply units 85d and 85f, are closed, the SC-1 liquid is prepared by mixing the aqueous hydrogen peroxide and aqueous ammonia, respectively supplied from the aqueous hydrogen peroxide supply unit 85b and aqueous ammonia supply unit 85c, and then the prepared SC-1 liquid is fed to the nozzle 82a of the third nozzle support arm 82r via the process liquid supply pipe 85a. Alternatively, in the state in which the open-and-close valves, respectively corresponding to the aqueous hydrogen peroxide supply unit 85b, aqueous ammonia supply unit 85c and pure water supply unit 85f, are closed, the pure water supplied from the pure water supply unit 85d can be heated by the heater 85e, and then the heated pure water can be fed to the nozzle 82a of the third nozzle support arm 82r via the process liquid supply pipe 85a. Otherwise, in the state in which the open-and-close valves, respectively corresponding to the aqueous hydrogen peroxide supply unit 85b, aqueous ammonia supply unit 85c and pure water supply unit 85d, are closed, the pure water of a normal temperature supplied from the pure water supply unit 85f can be fed to the nozzle 82a of the third nozzle support arm 82r. It is noted that the SC-1 liquid and/or pure water discharged from the nozzle 82a of the third nozzle support arm 82r is set at a temperature lower than the temperature of the SPM liquid discharged from the nozzle 82a of the first nozzle support arm 82p. For instance, this S-1 liquid and/or pure water is set lower than 80° C.

Further, as shown in FIG. 8(d), the nozzle 82a of a fourth nozzle support arm 82s of the four nozzle support arms 82 is provided as a downward-facing two-fluid nozzle. More specifically, a pure water supply pipe 86a and an N2 as supply pipe 86c are respectively connected with the nozzle 82a of the fourth nozzle support arm 82s, wherein a pure water supply unit 86b is connected with the pure water supply pipe 86a, and an N2 gas supply unit 86d is connected with the N2 as supply pipe 86c. With this configuration, the pure water supplied from the pure water supply unit 86b via the pure water supply pipe 86a and the N2 gas supplied from the N2 gas supply unit 86d via the N2 gas supply pipe 86c can be mixed together in the two-fluid nozzle. In this way, droplets (or liquid drops) of such pure water can be sprayed from the two-fluid nozzle.

In this embodiment, the level or the second nozzle support arm 82q is set higher than the level of the third nozzle support arm 82r. This configuration can prevent the second nozzle support arm 82q and third nozzle support arm 82r from being collided or affected relative to each other, even in the case in which the two nozzle support arms 82q and 82r are advanced, at the same time, into the outside cup peripheral case 50. Therefore, a step of supplying the cleaning water to the top plate 32 from the nozzle 82a of the second nozzle support arm 82q and a step of supplying the SC-1 liquid and/or pure water to the wafer W from the nozzle 82a of the third nozzle support arm 82r can be performed at the same time.

Further, in this embodiment, the side opening 50m of the outside cup peripheral case 50, when this case 50 is located in the upper position, is closed by a distal end of one nozzle support arm 82 when this nozzle support arm 82 is located in the retracted position. This configuration can prevent the atmosphere in the outside cup peripheral case 50 from being leaked to the exterior of the outside cup peripheral case 50.

Now referring to FIG. 6, the construction of the top plate 32 and each component located around the top plate 32 will be detailed. FIG. 6 shows one longitudinal cross section for illustrating the top plate 32 and each component located around the top plate 32.

As shown in FIG. 6, the top plate 32 is designed to be held by a top plate holding arm 35. A rotation shaft 34 is attached to the top of the top plate 32, and a bearing 34a is provided between the rotation shaft 34 and the top plate holding arm 35. Thus, the rotation shaft 34 can be rotated relative to the top plate holding arm 35. A pulley 34b is attached to the rotation shaft 34. In addition, a servomotor 36 is provided to a proximal end of the top plate holding arm 35, and another pulley 36h is provided to a distal end of the servomotor 36. One endless timing belt 36a is provided over the pulley 34b of the rotation shaft 34 and the pulley 36b of the servomotor 36. With the provision of the timing belt 36a, rotation drive force generated by the servomotor 36 is transmitted to the rotation shaft 34, and thus the top plate 32 is rotated about the rotation shaft 34. A cable 36c is connected with the servomotor 36, such that electric power can be supplied to the servomotor 36, via the cable 36c, from the exterior of a casing of the liquid, process apparatus 10. In this case, the rotation shaft 34, timing belt 36a, servomotor 36 and the like constitute together the top plate rotation mechanism for rotating the top plate 32 in the horizontal plane.

Further, as shown in FIGS. 4 and 6, a pivot shaft 37 is provided to the proximal end of the top plate holding arm 35, such that the top plate holding arm 35 can be pivot shafted about the pivot shaft 37. With this configuration, the top plate 32 can be reciprocated between an advanced position as shown by the solid line depicted in FIG. 4, in which the top plate 32 covers, from above, the wafer W held by the substrate holding unit 21, and a retracted position as shown by the two-dot chain line depicted in FIG. 4, in which the top plate 32 is retracted in the horizontal direction from the advanced position.

The outer diameter of the top plate 32 is slightly smaller than the inner diameter of the outside cup peripheral case 50. In this case, when the outside cup peripheral case 50 is elevated from the lower position to the upper position after the top plate 32 is moved to the advanced position, the top end of the cap circumference cylinder 50 is positioned slightly higher than the top plate 32. Namely, the top plate 32 is fully contained in the outside cup peripheral case 50.

In the arm standby chamber 80 of the liquid process apparatus 10, as shown in FIGS. 2 and 4, a top plate storage unit 38 is provided for storing therein the top plate 32 when the top plate 32 is retracted to the retracted position. One opening is provided to a side portion of the top plate storage unit 38, such that the top plate 32 can be completely stored in the top plate storage unit 38, via such a side opening of the top plate storage unit 38, when the top plate 32 is moved from the advanced position to the retracted position. Another exhaust unit 39 is provided to the top plate storage unit 38, such that the atmosphere in the top plate storage unit 38 can be always discharged by the exhaust unit 39. Thus, even in the case in which the droplets of the process liquid, such as the SPM liquid or the like, are attached to the bottom surface of the top plate 32 upon the liquid process for the wafer W, the atmosphere of the process liquid, such as the SPM liquid or the like, can be discharged by the exhaust unit 39 when the top plate 32 is stored in the top plate storage unit 38. Therefore, this configuration can prevent the atmosphere of the process liquid from being flowed into the arm standby chamber 80 and/or processing chamber 20.

Now referring to FIG. 7, the construction of the air hood 70 and each component located around the air hood 70 will be detailed. FIG. 7 shows one longitudinal cross section for illustrating the air hood 70 and each component located around the air hood 70.

As shown in FIG. 7, the air hood 70 includes one casing 72, the bottom of which is opened, and a bottom plate 77, such as a punching plate or the like, provided to the bottom of the casing 72 and having a plurality of openings 77a. Further, a filter 76 formed in a monolayer or multilayer structure is provided in the casing 72, and a flexible duct 74 is connected with the top of the casing 72. This duct 74 is communicated with the external environment of the casing of the liquid process apparatus 10. In addition, a fan (not shown) configured to feed the gas into the casing is provided to a proximal part of the duct 74. In the bottom plate 77, the plurality of openings 77a are provided for allowing the gas in the casing 72 to be flowed out downward. With such configuration, once the gas is fed into the casing 72 through the duct 74 from the external environment of the casing of the liquid process apparatus 10, the particles contained in the gas can be removed by the filter 76 in the casing 72. Thus, the purified gas can be flowed out downward from the openings 77a of the bottom plate 77.

Further, as shown in FIG. 7, an air hood lifting mechanism 78 configured to lift the air hood 70 is provided to the air hood 70. With the provision of this air hood lifting mechanism 78, the air hood 70 can be lifted between the lower position, in which the air hood 70 covers, from above, the wafer W held by the substrate holding unit 21, and the upper position located above the lower position. It is noted that the air hood 70 is shown, in FIG. 2, as one located in the upper position.

In addition, as shown in FIG. 2, the liquid process apparatus 10 includes a controller 200 that can serve to perform general control for the entire operation or the liquid process apparatus 10. For instance, the controller 200 is provided for controlling the operations of all functional parts provided in the liquid process apparatus 10 (e.g., the substrate holding unit 21, piston mechanism 24, servomotor 36, air hood lifting mechanism 78 and the like). This controller 200 can be implemented by providing a general-purpose computer or the like, as hardware, and a suitable program (such as a machine control program, a process recipe and the like) for operating the computer, as software. In this case, the software is stored in one storage medium, such as a hard disk drive or the like, fixedly provided to the computer, or stored in another storage medium, such as a CD-ROM, DVD, flash memory or the like, that is detachably set in the computer. Such a storage medium is shown by reference numeral 201 denoted in FIG. 2. A processor 202 serves to allow a predetermined process recipe to be read from the storage medium 201 and performed, as needed, based on a command or the like inputted from a user interface (not shown). In this way, each functional part of the liquid process apparatus 10 is operated under control of the controller 200 in order to perform each predetermined process. Alternatively, the controller 200 may be a system controller that can serve to control the entire liquid process system as shown in FIG. 1.

Next, referring to FIGS. 9 through 11, one exemplary series of steps in the cleaning process for removing an unnecessary resist film present on the top surface of the wafer W by using the aforementioned liquid process apparatus 10 will be described. It is noted that such a series of steps in the cleaning process as will be exemplified below are respectively performed by controlling the operation of each functional part of the liquid process apparatus 10 by using the controller 200.

First of all, as shown in FIG. 9(*a*), the top plate 32 is moved to the retracted position and stored in the top plate storage unit 38. Further, the air hood 70 is lowered from the upper position as shown in FIG. 2 to the lower position. In addition, the outside cup peripheral case 50 is moved to the lower position, and thus the substrate holding unit 21 is laterally opened. In this state, the lift pin plate 22 of the substrate holding unit 21 and the process liquid supply pipe 28 are respectively moved upward from the positions respectively shown in FIG. 5, and the shutter 94 provided for the opening 94a of the processing chamber 20 is retracted from the opening 94a. Thus, the opening 94e is opened. Then, the wafer W is carried into the processing chamber 20 from the exterior of the liquid process apparatus 10, via the opening 94a, by the transfer arm 104, and the carried wafer W is placed on the lift pins 23 of the lift pin plate 22. Thereafter, the transfer arm 104 is retracted from the processing chamber 20. At this time, each nozzle support arm 82 is located in the retracted position that is retracted from the processing chamber 20. In other words, each nozzle support arm 82 is waiting in the arm standby chamber 80. Meanwhile, the gas, such as the clean air or the like, is always fed, in a down flow manner, into the processing chamber 20 from the air hood 70, and is then discharged from the processing chamber 20. As such, the atmosphere in the processing chamber 20 can be replaced.

Subsequently, the lift pin plate 22 and process liquid supply pipe 28 are respectively moved downward to the lower positions thereof as respectively shown in FIG. 5. At this time, each holding member 25 provided to the holding plate 26 serves to laterally support the wafer W placed on the lift pins 23 and keep the wafer W slightly separated from each lift pin 23.

Thereafter, or when the lift pin plate 22 is lowered, the air hood 70 is moved from the lower position to the upper position as shown in FIG. 9(*b*), and then the top plate 32 is moved from the retracted position to the advanced position. In this way, the wafer W held by the substrate holding unit 21 is covered by the top plate 32. Once the top plate 32 is moved to the advanced position, the rotation drive force is given to the top plate 32 by the servomotor 36, and thus the top plate 32 is rotated about the rotation shaft 34 in the horizontal plane. Then, as shown in FIG. 9(*c*), the outside cup peripheral case 50 is elevated from the lower position to the upper position. More specifically, the top plate 32 is contained in the outside cup peripheral case 50 such that the top end of the outside cup peripheral case 50 is positioned slightly higher than the top plate 32. As a result, a proper space that is isolated from the exterior is provided around the wafer W by the top plate 32 and outside cup peripheral case 50. Hereinafter, the space that is formed inside the top plate 32 and outside cup peripheral case 50 and isolated from the exterior will be referred to as "the first process space". As will be described later, the first process space is used as the space in which the liquid process using the SPM liquid obtained by mixing the sulfuric acid with the aqueous hydrogen peroxide is provided to the wafer W.

After the outside cup peripheral case 50 is moved to the upper position, the first nozzle support arm 82p of the four nozzle support arms 82 respectively waiting in the arm standby chamber 82 is advanced into the processing chamber 20 via the side opening 50m of the outside cup peripheral case 50 (see FIG. 9(d)). At this time, the first nozzle support arm 82p is moved linearly.

Next, the holding plate 26 and lift pin plate 22 of the substrate holding unit 21 are rotated, respectively. With the rotation of the two plates 26 and 21, the wafer W that is supported by each holding member 25 of the holding plate 26 is also rotated. In the state in which the wafer W is rotated, the SPM liquid is supplied to the top surface of the wafer W from the nozzle 82a of the first nozzle support arm 82p advanced in the outside cup peripheral case 50. At this time, the SPM liquid supplied to the top surface of the wafer W is heated up to the high temperature, e.g., 100° C. or higher, more preferably about 170° C. In this way, the SPM liquid is supplied to the top surface of the wafer W in order to perform the SPM process for the wafer W. In this liquid process step, a resist formed on the surface of the wafer W is peeled off. Thereafter, the resist peeled off from the wafer W is fed, together with the SPM liquid, to the first discharge unit 46a due to the centrifugal force exerted from the rotated wafer W, and then discharged from the discharge unit 46a. More specifically, when the SPM process is performed for the wafer W, the guide cup 44 is located in the lower position. Thus, the SPM liquid and/or peeled resist is fed to the first discharge unit 46a and then collected. In this case, by moving the nozzle 82a of the first nozzle support arm 82p, in the lateral direction (or left and right) in FIG. 9(d), with the SPM liquid being discharged toward the wafer W from the nozzle 82a, the SPM liquid can be supplied evenly and uniformly over the entire region of the wafer W.

As described above, when the SPM process is provided to the wafer W, the first process space formed inside the top plate 32 and outside cup peripheral case 50 can serve to prevent the atmosphere in the first process space from being leaked to the exterior as well as prevent the atmosphere of the exterior from entering the first process space. Further, with the rotation of the top plate 32 in the horizontal plane, the droplets of the process liquid, such as the SPM liquid or the like, attached to the top plate 32 can be fed to an inner wall surface of the outside cup peripheral case 50 by the centrifugal force. As a result, such droplets will fall down, by the weight thereof, along the inner wall surface of the outside cup peripheral case 50, thereby to prevent the reattachment of the droplets of the process liquid, such as the SPM liquid or the like, to the wafer W.

Thereafter, once the SPM process for the wafer W is ended, as shown in FIG. 9(e), the first nozzle support arm 82p advanced in the outside cup peripheral case 50 is retracted from the processing chamber 20 to wait in the arm standby chamber 80. At this time, the wafer W and top plate 32 are kept to be rotated, respectively. In this case, when the first nozzle support arm 82p is retracted from the interior of the outside cup peripheral case 50 and moved to the retracted position, the cleaning process for the first nozzle support arm 82p is performed by the arm cleaning unit 88. This cleaning process can remove dirt, such as the SPM liquid or the like, attached to the first nozzle support arm 82p.

Then, the third nozzle support arm 82r of the four nozzle support arms 82 respectively waiting in the arm standby chamber 80 is advanced into the processing chamber 20 via the side opening 50m of the outside cup peripheral case 50 (see FIG. 9(f)). At this time, the third nozzle support arm 82r is moved linearly. Thereafter, the heated pure water (e.g., the pure water of 80° C.) is supplied toward the center of the wafer W from the nozzle 82a of the third nozzle support arm 82r advanced in the outside cup peripheral case 50, with the wafer W and top plate 32 being rotated respectively. In this case, the heated pure water is supplied toward the bottom surface (or back surface) of the wafer W from the process liquid supply pipe 28. With this operation, a hot rinse process is provided to the wafer W.

It is noted that an intermediate process step, as will be described later, is performed during a period of time between the SPM process (see FIG. 9(d)) and the hot rinse process (see FIG. 9(f)) for the wafer W. This intermediate process step is composed of a first intermediate process step, a shake-off process step and a second intermediate process step. Specifically, in the first intermediate process step, a first intermediate process liquid of a predetermined temperature lower than the temperature of the SPM liquid and higher than the temperature of the rinse liquid is supplied to the surface of the wafer W. More specifically, only the open-and-close valve provided on the side of the aqueous hydrogen peroxide supply unit 83b is closed, while the open-and-close valve on the side of the sulfuric acid supply unit 83c is kept to be opened. In this state, only the sulfuric acid heated by the heater 83d is discharged, for a predetermined time, toward the center of the surface of the wafer W from the nozzle 82a of the first nozzle support arm 82p. At this time, because the aqueous hydrogen peroxide is not supplied, the chemical reaction between the aqueous hydrogen peroxide and the sulfuric acid is not caused. Therefore, the sulfuric acid of the temperature (e.g., 140° C.) that is lower than the temperature (e.g., 170° C.) of the SPM liquid and equal to or higher than the temperature (e.g., 80° C.) of the rinse liquid (or pure water) is supplied to the surface of the wafer W. Namely, due to this first intermediate process step, the temperature of the wafer W can be gradually lowered to a proper intermediate temperature, rather than being steeply lowered from the temperature of the SPM liquid to the temperature of the rinse liquid. Thus, unwanted heat deformation that may be caused by steep temperature change of the wafer W can be prevented. As such, the wafer W can be held, in a suitable condition, by the substrate holding unit 21.

Next, the shake-off process step for shaking off and removing the sulfuric acid from the surface of the wafer W by rotating the wafer W is performed. In this step, the wafer W is rotated, for a given time, at a speed higher than the rotation speed employed in the SPM process and first intermediate process step. Thereafter, the second intermediate process step is performed by supplying a second intermediate process liquid of a given temperature that is lower than the temperature of the first intermediate process liquid (i.e., the sulfuric acid) and equal to or higher than the temperature of the rinse liquid to the hack surface of the wafer W. More specifically, the pure water of the temperature (e.g., 80° C.) that is lower than the temperature (e.g., 140° C.) of the first intermediate process liquid (i.e., the sulfuric acid) and equal to or higher than the temperature (e.g., 80° C.) of the rinse liquid is supplied to the process liquid supply pipe 28 from the process liquid supply unit 29, and then the supplied pure water of 80° C. is discharged toward the back surface of the wafer W from the head part 28a of the process liquid supply pipe 28. Due to this second intermediate process step, the temperature of the wafer W can be gradually lowered to a suitable temperature around the temperature of the rinse process, from the back surface of the wafer W. In particular, since the pure water is supplied to the back surface of the wafer W, occurrence of some violent chemical reaction between the sulfuric acid and rinse liquid (or pure water) can be prevented, even in the case in which some amount of the first intermediate process liquid (i.e., the sulfuric acid) remains on the surface of the wafer W. As such, scattering of some chemical products associated with the chemical reaction as well as contamination in the outside cup peripheral case 50 can be prevented, respectively.

As described above, with the provision or the intermediate process step that is composed of the first intermediate process step, shake-off process step and second intermediate process step and is performed during the period of time between the SPM process and the hot rinse process for the wafer W, the occurrence of the violent chemical reaction between the SPM liquid and the rinse liquid (or pure water) can be well prevented. Thus, the scattering of the chemical products associated with the chemical reaction as well as the contamination in the outside cup peripheral case 50 can be prevented, respectively.

Once the hot rinse process for the wafer W is ended, as shown in FIG. 10(g), the third nozzle support arm 82r advanced in the outside cup peripheral case 50 is retracted from the outside cup peripheral case 50 to wait in the arm standby chamber 80. At this time, the wafer W is kept to be rotated. During the period of time in which the third nozzle support arm 82r is retracted from the outside cup peripheral case 50 and moved to the retracted position, the cleaning process for the third nozzle support arm 82r is performed by the arm cleaning unit 88. With this cleaning process, the dirt attached to the third nozzle support arm 82r can be removed. Further, the pure water (e.g., the pure water of 80° C.) has been supplied toward the center of the wafer W by the fixed rinse nozzle 43, before the third nozzle support arm 82r is retracted from the outside cup peripheral case 50. Therefore, since the pure water is supplied to the surface of the wafer W by the fixed rinse nozzle 43 and the whole surface of the wafer W is filled with the pure water, the surface of the wafer W can be kept not to be directly exposed to the outside, thereby to prevent attachment of the particles onto the surface of the wafer W.

Then, as shown in FIG. 10(h), the outside cup peripheral case 50 is lowered from the upper position to the lower position. Thereafter, the rotation of the top plate 32 is stopped. At this time, the pure water (e.g., the pure water of 80° C.) is kept to be supplied toward the center of the wafer W by the fixed rinse nozzle 43. Once the outside cup peripheral case 50 is moved to the lower position, the outside cup peripheral case 50 is dipped in the cleaning liquid accumulated in the accumulation section 52a of the cleaning unit 52. In this way, the outside cup peripheral case 50 can be cleaned, thereby to prevent the droplets of the process liquid, such as the SPM liquid or the like, scatted upon the SPM process for the wafer W from remaining on the inner wall of the outside cup peripheral case 50.

Thereafter, as shown in FIG. 10(i), the top plate 32 is moved from the advanced position to the retracted position, and is stored in the top plate storage unit 38. In this case, the atmosphere in the top plate storage unit 38 is always discharged by the exhaust unit 39. Therefore, even in the case in which the droplets of the process liquid, such as the SPM liquid or the like, are attached to the bottom surface of the top plate 32 upon the SPM process for the wafer W, the atmosphere of the process liquid, such as the SPM liquid or the like, can be discharged by the exhaust unit 39 when the top plate 32 is stored in the top plate storage unit 38. Thus, such storage of the top plate 32 in the top plate storage unit 38 can prevent the atmosphere of the SPM liquid from entering the arm standby chamber 80 and/or processing chamber 20.

Then, as shown in FIG. 10(j), the outside cup peripheral case 50 cleaned by the cleaning unit 52 is elevated from the lower position to the upper position. At this time, the pure water (e.g., the pure water of 80° C.) is kept to be supplied toward the center of the wafer W by the fixed rinse nozzle 43. Thereafter, as shown in FIG. 10(k), the air hood 70 is lowered from the upper position to the lower position. More specifically, the air hood 70 is lowered, such that the bottom surface of the bottom plate 77 of the air hood 70 is brought in contact with or close to the top end of the outside cup peripheral case 50. With this operation, the space that is isolated from the exterior is provided around the wafer W by the air hood 70 and outside cup peripheral case 50. Hereinafter, the space that is formed inside the air hood 70 and outside cup peripheral case 50 and isolated from the exterior will be referred to as "the second process space". As will be described later, the second process space is used as the space in which the purified gas is flowed downward from the air hood 70. Once the air hood 70 is lowered to the lower position, the supply of the pure water by the fixed rinse nozzle 43 is stopped.

Thereafter, the third nozzle support arm 82r of the four nozzle support arms 82 respectively waiting in the arm standby chamber B0 is advanced into the processing chamber 20 via the side opening 50m of the outside cup peripheral case 50 (see FIG. 10 (l)). At this time, the third nozzle support arm 82r is moved linearly. Then, the SC-1 liquid is supplied toward the center of the wafer W from the nozzle 82a of the third nozzle support arm 82r advanced in the outside cup peripheral case 50, with the wafer W being rotated as well as with the purified gas being flowed in the second process space from the air hood 70. Due to such supply of the SC-1 liquid, the resist remaining on the surface of the wafer W can be removed. When the liquid process using the SC-1 liquid is performed for the wafer W, the guide cup 44 is located in the upper position. As such, the SC-1 liquid and removed residual resist can be fed to the second discharge unit 46b and then discharged therefrom.

In addition, when the liquid process using the SC-1 liquid is performed for the wafer W, the second process space formed inside the air hood 70 and outside cup peripheral case 50 can serve to prevent the atmosphere in the second process space from being leaked to the exterior as well as prevent the atmosphere of the exterior from entering the second process space. In this case, since the second process space is formed into a closed space, the volume of the space in which the liquid process is performed can be substantially decreased. As such, the efficiency of replacing the purified gas in the second process space can be enhanced.

Once the liquid process using the SC-1 liquid for the wafer W is ended, as shown in FIG. 11(m), the third nozzle support arm 82r advanced in the outside cup peripheral case 50 is retracted from the outside cup peripheral case 50 to wait in the arm standby chamber 80. At this time, the wafer W is kept to be rotated. Further, when the third nozzle support arm 82r is retracted from the outside cup peripheral case 50 to the retracted position, the third nozzle support arm 82r is cleaned by the arm cleaning unit 88. With this cleaning process, the dirt, such as the SC-1 liquid or the like, attached to the third nozzle support arm 82r can be removed. In this case, the purified gas is kept to be flowed in the second process space from the air hood 70 after the third nozzle support arm 82r is retracted from the outside cup peripheral case 50. Thereafter, the third nozzle support arm 82r of the four nozzle support arms 82 respectively waiting in the arm standby chamber 80 is advanced into the processing chamber 20 via the side opening 50m of the outside cup peripheral case 50. At this time, the third nozzle support arm 82r is moved linearly. Then, the pure water of the normal temperature is supplied toward the center of the wafer W from the nozzle 82a of the third nozzle support arm 82r advanced in the outside cup peripheral case 50, with the wafer W and top plate 32 being rotated respectively. In this case, the pure water of the normal temperature is supplied toward the bottom surface (or back surface) of the wafer W from the process liquid supply pipe 28. With this operation, a rinse process is provided to the wafer W. Thereafter, the wafer W is rotated at a high speed in order to perform the drying process for the wafer W in the second process space.

After the process liquid using the SC-1 liquid for the wafer W is ended and the third nozzle support arm 82*r* is retracted from the outside cup peripheral case 50 and before the drying process for the wafer W is performed, the fourth nozzle support arm 82*s* may be advanced into the outside cup peripheral case 50 to perform the rinse process for the wafer W by spraying the droplets of the pure water toward the wafer W by using the two-fluid nozzle of the fourth nozzle support arm 82*s*. In this case, the purified gas is kept to be flowed in the second process space from the air hood 70 after the rinse process for the wafer W is ended and then the fourth nozzle support arm 82*s* is retracted from the outside cup peripheral case 50. Thereafter, the wafer W is rotated at the high speed to perform the drying process for the wafer W in the second process space.

Once the drying process for the wafer W is ended, as shown in FIG. 11(*n*), the outside cup peripheral case 50 is lowed from the upper position to the lower position. Thus, the substrate holding unit 21 is laterally opened. Thereafter, the lift pin plate 22 and process liquid supply pipe 28 of the substrate holding unit 21 are respectively moved upward from the positions respectively shown in FIG. 5, and the shutter 94 provided for the opening 94*a* of the processing chamber 20 is retracted from the opening 94*a*. As such, the opening 94*a* is opened. Then, the transfer arm 104 is moved into the processing chamber 20 from the exterior of the liquid process apparatus 10 via the opening 94*a*, and the wafer W placed on the lift pins 23 of the lift pin plate 22 is transferred onto the transfer arm 104. Thereafter, the wafer W taken out by the transfer arm 104 is carried out to the exterior of the process liquid machine 10. In this way, one series of steps in the liquid process for the wafer W are completed.

Now referring to FIG. 11(*o*), the cleaning process for the top plate 32 will be described. Upon the cleaning process for the top plate 32, the air hood 70 is moved from the lower position to the upper position, and then the top plate 32 is moved from the retracted position to the advanced position. Once the top plate 32 is moved to the advanced position, the rotation drive force is given to the top plate 32 by the servomotor 36, thus the top plate 32 is rotated in the horizontal plane about the rotation shaft 34. Thereafter, the outside cup peripheral case 50 is elevated from the lower position to the upper position.

Once the outside cup peripheral case 50 is moved to the upper position, the second nozzle support arm 82*q* of the four nozzle support arms 82 respectively waiting in the arm standby chamber 80 is advanced into the processing chamber 20 via the side opening 50*m* of the outside cup peripheral case 50. At this time, the second nozzle support arm 82*q* is moved linearly.

Thereafter, the cleaning liquid for the top plate (or top plate cleaning liquid), such as the pure water or the like, is discharged toward the top plate 32 from the nozzle 82*a* of the second nozzle support arm 82*q* advanced in the outside cup peripheral case 50. Thus, the SPM liquid or the like liquid attached to the top plate 32 can be removed. In this case, by moving the nozzle 82*a* of the second nozzle support arm 82*q*. In the lateral direction (or left and right) in FIG. 11(*o*), with the tap plate cleaning liquid, such as the pure water or the like, being discharged toward the top plate 32 from the nozzle 82*a*, the cleaning liquid can be supplied evenly and uniformly over the entire region of the top plate 32. During this cleaning process for the top plate 32, the closed space is formed inside the top plate 32 and outside cup peripheral case 50. As such, this closed space can serve to prevent the top plate cleaning liquid discharged from the nozzle 82*a* of the second nozzle support arm 82*q* from being leaked to the outside of the outside cup peripheral case 50.

It is noted that the cleaning process for the top plate 32 as described above may be performed each time after the process for removing the resist film present on the wafer W or each time after the cleaning process for the wafer W. Otherwise, the cleaning process for the top plate 32 may be performed periodically. Alternatively or additionally, the cleaning process for the top plate 32 may be performed in parallel with the hot rinse process for the wafer W as shown in FIG. 9(*f*). In the case in which the cleaning process for the top plate 32 and the hot rinse process for the wafer W are performed at the same time, the second nozzle support arm 82*q* and third nozzle support arm 82*r* are advanced, at the same time, into the outside cup peripheral case 50. In this case, the level of the second nozzle support arm 82*q* is set higher than the level of the third nozzle support arm 82*r*. This configuration can prevent the second nozzle support arm 82*q* and third nozzle support arm 82*r* from being collided or affected relative to each other when the two nozzle support arms 82*q* and 82*r* are advanced, at the same time, into the outside cup peripheral case 50. Therefore, the step of supplying the top plate cleaning liquid, such as the pure water or the like, to the top plate 32 from the nozzle 82*a* of the second nozzle support arm 82*q* and the step of supplying the heated pure water to the wafer W from the nozzle 82*a* of the third nozzle support arm 82*r* can be performed at the same time. It is noted that the cleaning process for the top plate 32 may be performed by supplying the rinse liquid to the top plate 32 from the fixed rinse nozzle 43.

As stated above, according to the liquid process apparatus 10 of this embodiment, the top plate rotation mechanism (e.g., the rotation shaft 34, timing belt 36*a*, servomotor 36 and the like) for rotating the top plate 32 in the horizontal plane is provided for the top plate 32. Further, the outside cup peripheral case 50 arranged around the rotation cup 40 is designed to move between the upper position, in which the top end of the outside cup peripheral case 50 is positioned above the rotation cup 40, and the lower position located below the upper position. In addition, each nozzle support arm 82 for supporting the nozzle 82*a* is designed to be moved in the horizontal direction between the advanced position, in which the nozzle support arm 82 is advanced into the outside cup peripheral case 50 via the side opening 50*m* of the outside cup peripheral case 50 when the outside cup peripheral case 50 is located in the upper position, and the retracted position, in which the nozzle support arm 82 is retracted to the outside of the outside cup peripheral case 50. With this configuration, by supplying the SPM liquid to the wafer W, with the top plate 32 being rotated in the horizontal plane, after the outside cup peripheral case 50 is moved to the upper position upon the SPM process for the wafer W, the SPM liquid attached to the top plate 32 will be fed to the inner wall surface of the outside cup peripheral case 50 by the centrifugal force, and then fall down by the weight thereof along the inner wall surface of the outside cup peripheral case 50. As such, the reattachment of the SPM liquid to the wafer W can be prevented. Further, by moving each nozzle support arm 82 in the horizontal direction when supplying the process liquid, such as the SPM liquid or the like, to the wafer W from the nozzle 82a, the process liquid can be supplied evenly and uniformly over the entire surface of the wafer W.

Further, according to the liquid process apparatus 10 of this embodiment, the top plate 32 is designed to be moved, in the horizontal direction, between the advanced position (see the solid line depicted in FIG. 4), in which the top plate 32 covers, from above, the wafer W held by the substrate holding unit 21, and the retracted position (see the two-dot chain line depicted in FIG. 4), in which the top plate 32 is retracted in the horizontal direction from the advanced position. Meanwhile, the air hood 70 configured to flow the purified gas downward is designed to move between the lower position, in which the air hood 70 covers, from above, the wafer W held by the substrate holding unit 21, and the upper position located above the lower position. With this configuration, when the resist film present on the top surface of the wafer W is removed in the SPM process, the top plate 32 is moved to the advanced position to prevent the fumes, which consist of the gas or mist that is generated on the wafer W and derived from the SPM liquid or the like object to be processed, from being scattered upward. Therefore, unwanted contamination or corrosion caused by such fumes on the inner waif of the processing chamber 20 and each part provided in the processing chamber 20, respectively located above the wafer W, can be prevented, as well as generation of matter that may cause wafer contamination can be prevented. In addition, the movement of the top plate 32 to the retracted position, upon the liquid process using the SC-1 liquid and/or drying process performed after the SPM process, can prevent the SPM liquid attached to the top plate 32 from being dropped onto the wafer W. Further, by directing the down flow of the clean air toward the top surface of the wafer W from the air hood 70, the attachment of the particles floating over the wafer W onto the surface of the wafer W can be prevented upon the liquid process using the SC-1 liquid and/or drying process. Thus, various processes can be performed without the contamination of the wafer W.

Further, in the liquid process apparatus 10 of this embodiment, when one nozzle support arm 82 is located in the retracted position, the distal end of this nozzle support arm 82 closes the side opening 50m formed in the side surface of the outside cup peripheral case 50 when this cylinder 50 is located in the upper position. This configuration can prevent the atmosphere in the outside cup peripheral case 50 from being leaked to the outside of the cylinder 50 via the side opening 50m.

Further, in the liquid process apparatus 10 of this embodiment, the cleaning unit 52 configured to clean the outside cup peripheral case 50 is provided. More specifically, the cleaning unit 52 includes the accumulation section 52a configured to accumulate therein the cleaning liquid, and when the outside cup peripheral case 50 is located in the lower position, the outside cup peripheral case 50 is dipped in the cleaning liquid accumulated in the accumulation section 52a. With this configuration, the outside cup peripheral case 50 can be cleaned by the cleaning unit 52 after the SPM process for the wafer W is ended. As such, this cleaning process can prevent the SPM liquid or the like liquid, which has been scattered upon the SPM process and then attached to the inner wall of the outside cup peripheral case 50, from remaining on the outside cup peripheral case 50.

Further, in the liquid process apparatus 10 of this embodiment, the process liquid supplied from the nozzle 82a of the first nozzle support arm 82p is the mixture (i.e., the SPM liquid) of sulfuric acid and aqueous hydrogen peroxide. In this case, the process liquid (or SPM liquid) of the high temperature is supplied from the nozzle 82a of the first nozzle support arm 82p to the wafer W held by the substrate holding unit 21. Thereafter, once the air hood 70 is moved to the lower position, an additional liquid process using another process liquid of the temperature lower than the high-temperature process liquid (i.e., the SPM liquid) is provided to the wafer W, with the purified gas being flowed downward from the air hood 70. More specifically, the process liquid of the temperature lower than the high-temperature process liquid (i.e., the SPM liquid) is the mixture (i.e., the SC-1 liquid) of aqueous ammonia and aqueous hydrogen peroxide.

Further, in the liquid process apparatus 10 of this embodiment, the nozzle (or top plate cleaning liquid supply nozzle) 82a that is configured to supply the top plate cleaning liquid, such as the pure water or the like, from below, to the bottom surface of the top plate 32, is supported by the second nozzle support arm 82q. With this configuration, the top plate cleaning liquid, such as the pure water or the like, can be discharged toward the top plate 32 from the nozzle 82a of the second nozzle support arm 82q advanced in the outside cup peripheral case 50, with the outside cup peripheral case 50 being located in the upper position as well as with the top plate 32 being rotated. Thus, the SPM liquid or the like liquid attached to the top plate 32 can be removed by the top plate cleaning liquid. In this case, when the cleaning process is performed for the top plate 32, the closed space is formed inside the top plate 32 and outside cup peripheral case 50. This closed space can serve to prevent the top plate cleaning liquid discharged from the nozzle 82a of the second nozzle support arm 82q from being leaked to the outside of the outside cup peripheral case 50.

It should be appreciated that the liquid process apparatus according to this embodiment is not limited to the aspect as described above, and it should be construed that various modifications can be made thereto.

Figure 12A:
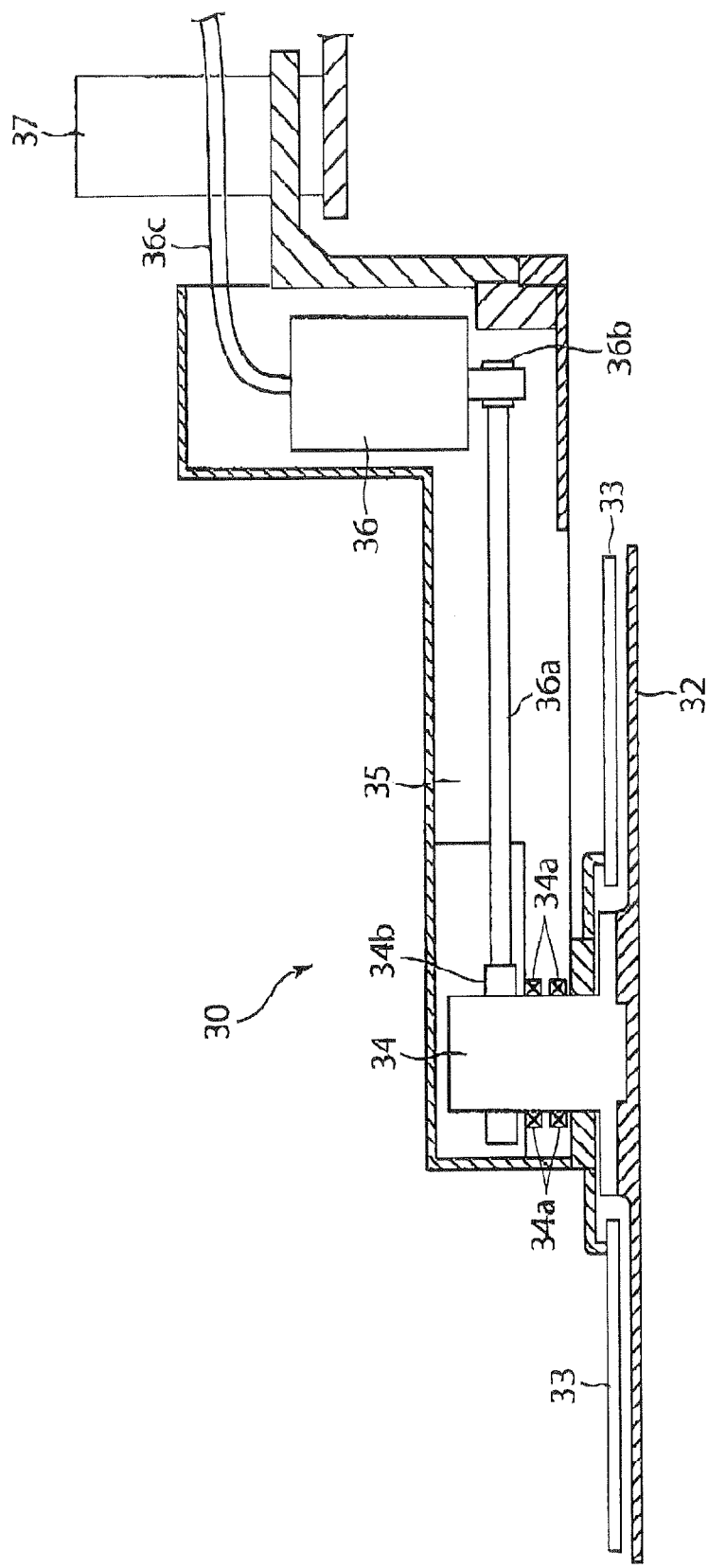
FIG. 12A is a diagram for illustrating one variation of the top plate of the liquid process apparatus shown in FIG. 2.

For instance, as shown in FIG. 12A, an LED lamp 33 that can serve as a top plate heating mechanism for heating the top plate 32 may be provided to the top plate holding arm 35. In this case, while the top plate 32 is provided to be rotated, the LED lamp 33 is provided not to be rotated. As described above, the SPM liquid is discharged to the top surface of the wafer W in order to remove the resist film provided on the top surface of the wafer W. However, in this case, the ability of the SPM liquid to remove the resist film can be enhanced as the temperature of the SPM liquid is elevated. Therefore, by providing the LED lamp 33 in the vicinity of the top plate 32 in order to heat the top plate 32 by using the LED lamp 33, the atmosphere around the wafer W held by the substrate holding unit 21 can also be heated. As such, the SPM liquid discharged to the top surface of the wafer W can also be heated. Thus, the ability of the SPM liquid to remove the resist film can be enhanced. Further, even in the case in which the SPM liquid is attached to the bottom surface of the top plate 32, this SPM liquid can be vaporized by the effect of the LED lamp 33.

Figure 12B:
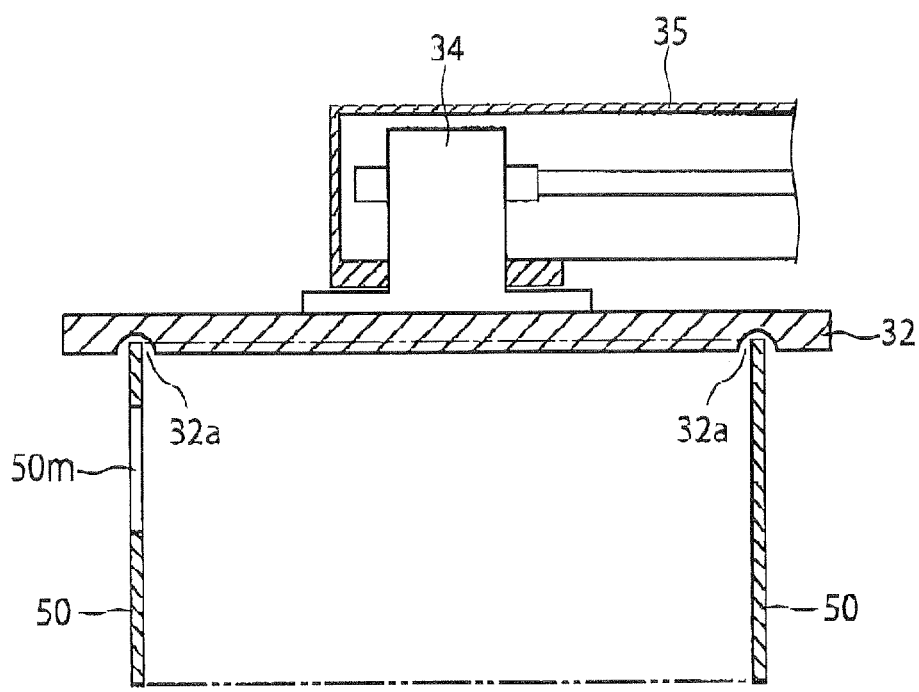
FIG. 12B is a diagram for illustrating another variation of the top plate and outside cup peripheral case of the liquid process apparatus shown in FIG. 2.

Further, as shown in FIG. 12, the outer diameter of the top plate 32 may be set greater than the inner diameter of the outside cup peripheral case 50. For instance, a proper groove 32a is formed in the bottom surface of the top plate 32. With this configuration, when the outside cup peripheral case 50 is elevated from the lower position to the upper position after the top plate 32 is moved to the advanced position, the top end of the outside cup peripheral case 50 is fitted in the groove 32a formed in the bottom surface of the top plate 32. Also in this case, the space isolated from the exterior can be formed around the wafer W by the top plate 32 and outside cup peripheral case 50, and used as the space in which the liquid process using the SPM liquid obtained by mixing the sulfuric acid with the aqueous hydrogen peroxide is provided to the wafer W.

Figure 13:
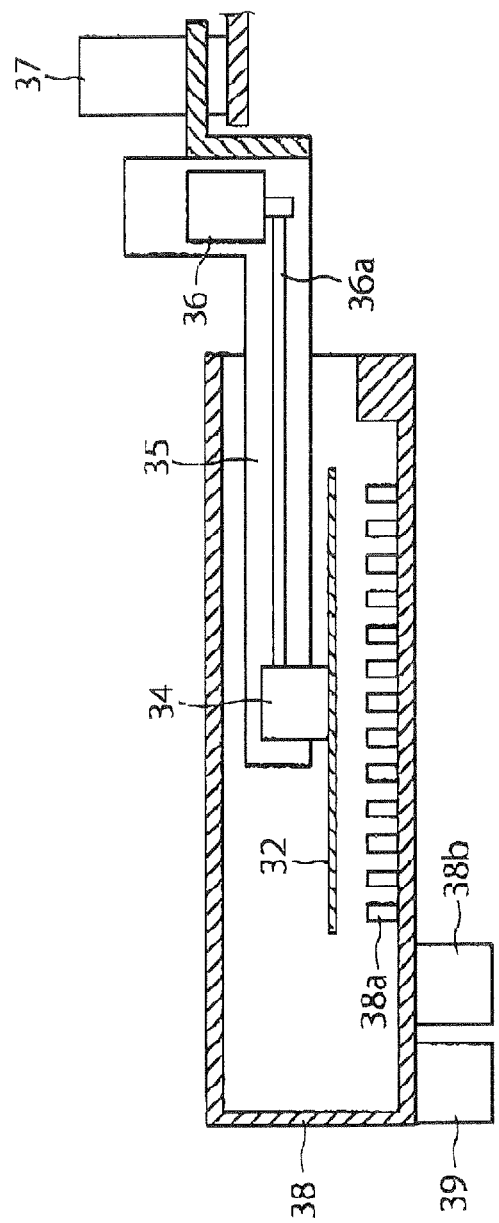
FIG. 13 is a diagram for illustrating one variation of a top plate storage unit of the liquid process apparatus shown in FIG. 2.

Additionally, as shown in FIG. 13, a top plate cleaning mechanism 38a for cleaning the top plate 32 stored in the top plate storage unit 38 may be provided to the top plate storage unit 38. More specifically, the top plate cleaning mechanism 38a is composed of a plurality of nozzles respectively facing upward, and is designed to discharge the cleaning liquid, such as the pure water or the like, upward from each nozzle. In this case, when the top plate 32 is stored in the top plate storage unit 38, the cleaning liquid is discharged upward from each nozzle of the top plate cleaning mechanism 38a, thereby to perform the cleaning process for the bottom surface of the top plate 32. Further, a draining unit 38b is provided to the top plate storage unit 38, such that the cleaning liquid, such as the pure water or the like, supplied to the top plate 32 from each nozzle of the top plate cleaning mechanism 38a can be drained by the draining unit 38b.

Further, in the liquid process apparatus 10 of this embodiment, another process liquid supply nozzle configured to supply the SPM liquid to the wafer W may be provided to the bottom surface of the top plate 32, in place of each nozzle support arm 82 configured to support the four nozzles 82a and provided to be moved in the horizontal direction between the advanced position located in the outside cup peripheral case 50 and the retracted position that is retracted from the advanced position. In this case, the provision of each nozzle 82a for supplying the SPM liquid and provision of the nozzle arm support arm 82 for supporting this nozzle 82a can be omitted.

Additionally, the liquid process using the SC-1 liquid may be omitted in the cleaning process step for the wafer W. In this case, the top plate 32 is moved to the retracted position and the air hood 70 is moved to the lower position after the hot rinse process for the wafer W is performed as shown in FIG. 9(f). Thereafter, as shown in FIG. 11(m), the wafer W is rotated at the high speed, with the purified gas being flowed from the air hood 70 into the space in the outside cup peripheral case 50. Thus, the drying process for the wafer W can be performed.

Second Embodiment

Figure 14:
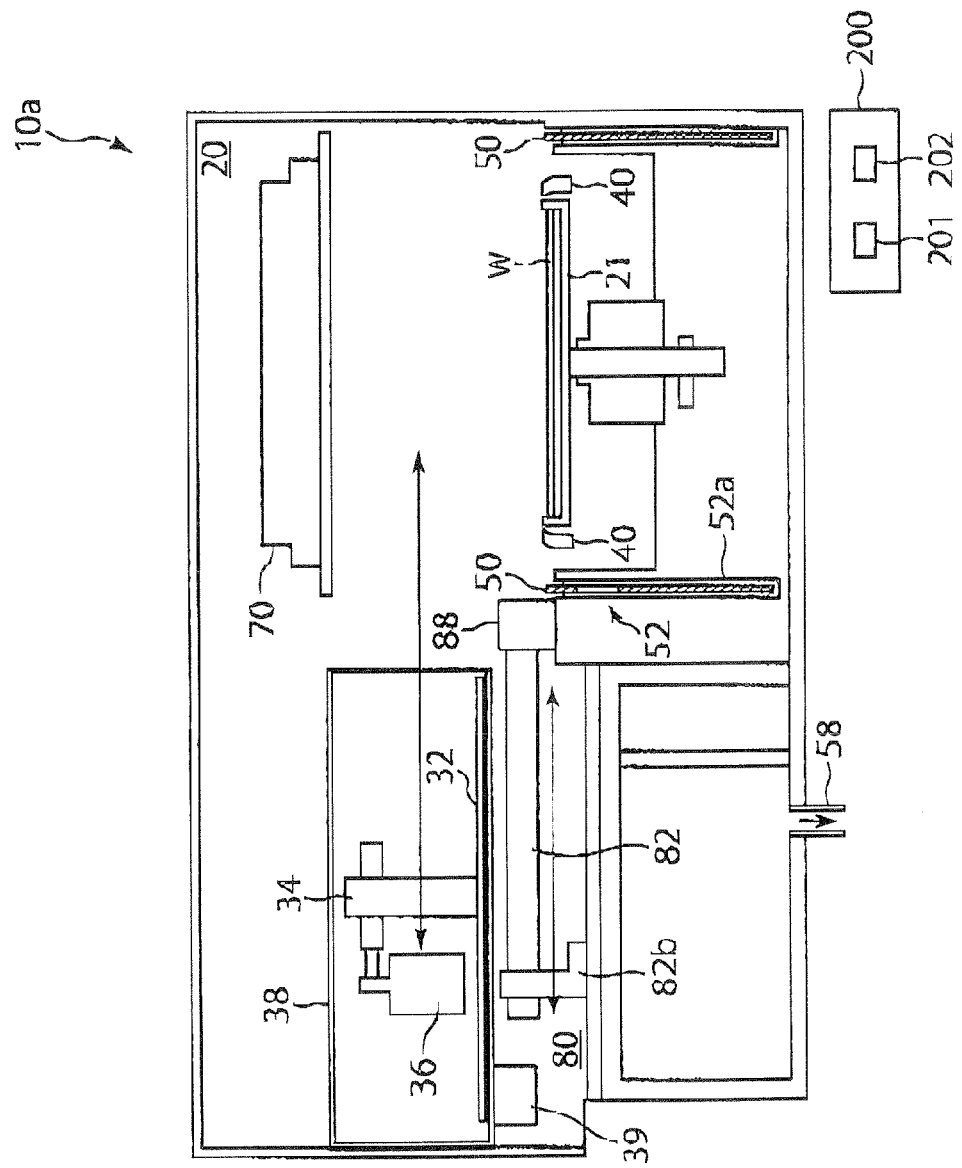
FIG. 14 is a side view for illustrating the liquid process apparatus related to a second embodiment of the present invention, with the outside cup peripheral case being located in a first position.
Figure 15:
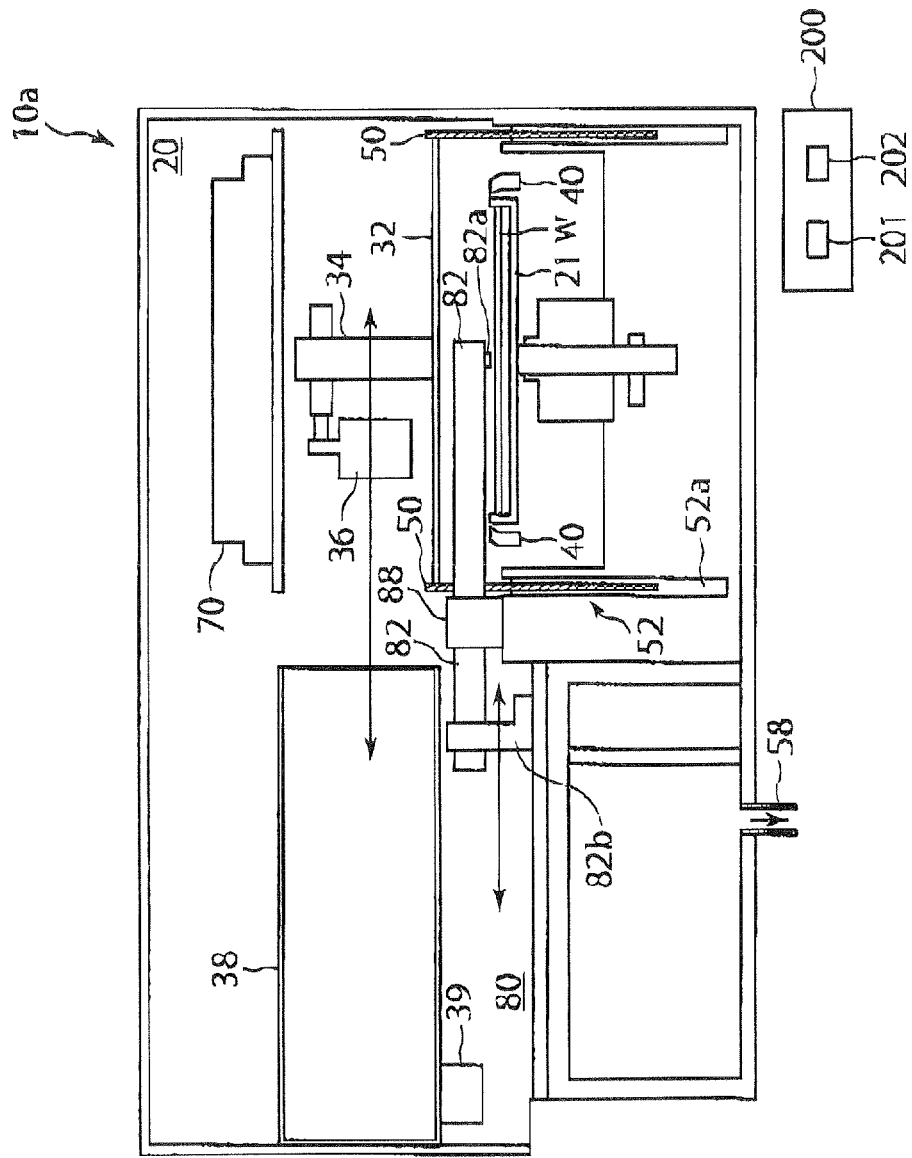
FIG. 15 is a side view for illustrating the liquid process apparatus related to the second embodiment of the present invention, with the outside cup peripheral case being located in a second position located above the first position.
Figure 16:
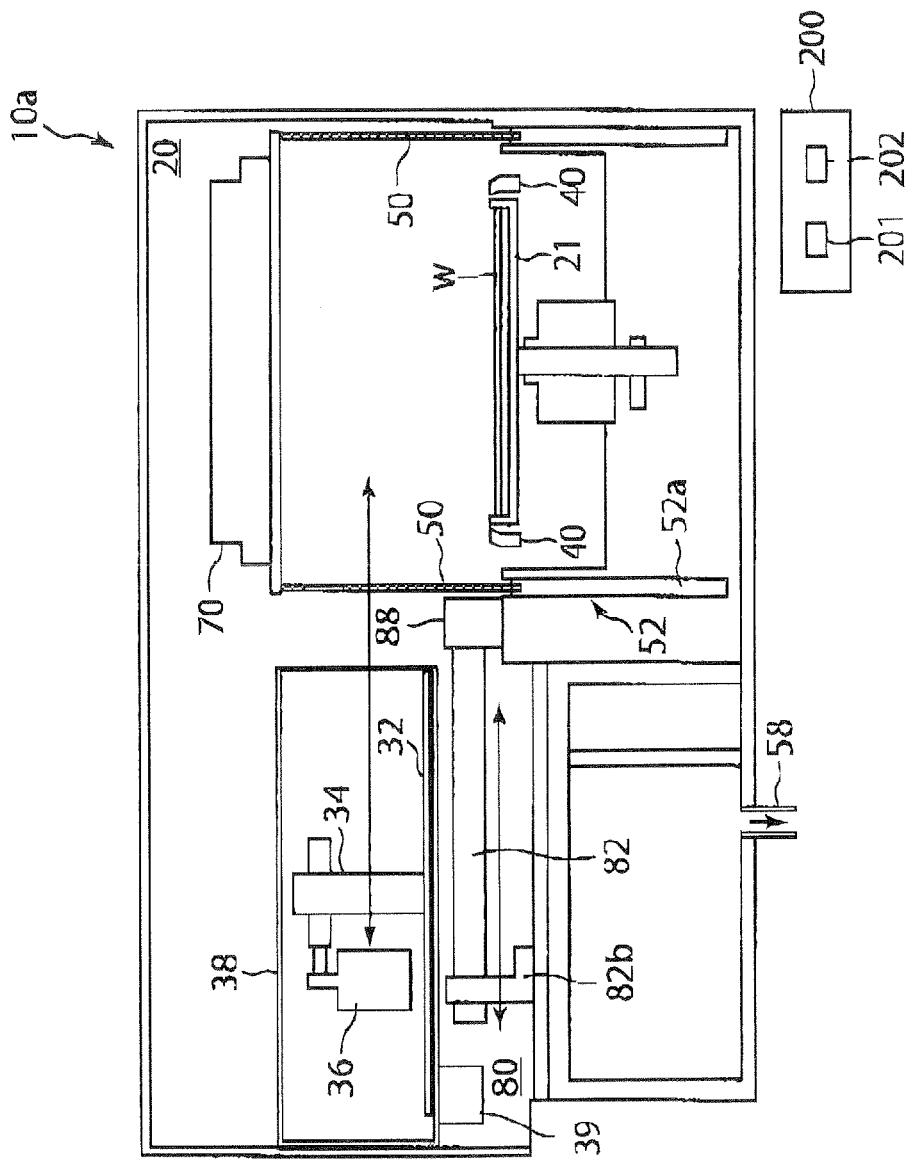
FIG. 16 is a side view for illustrating the liquid process apparatus related to the second embodiment of the present invention, with the outside cup peripheral case being located in a third position located above the second position.

Hereinafter, referring to FIGS. 14 through 16, the liquid process apparatus related to the second embodiment of the present invention will be described. In the liquid process apparatus related to the second embodiment, as compared with the liquid process apparatus related to the first embodiment, the air hood 70 is fixed in position, and thus designed not to move. Further, in the liquid process apparatus related to the second embodiment, the outside cup peripheral case 50 is set higher than the outside cup peripheral case 50 provided in the liquid process apparatus related to the first embodiment. More specifically, the outside cup peripheral case 50 is designed to move among three positions, i.e., the first position as shown in FIG. 14, second position as shown in FIG. 15 and third position as shown in FIG. 16. Hereinafter, the description on like parts respectively provided in the liquid process apparatus related to the first embodiment will be omitted in the description for the liquid process apparatus related to the second embodiment.

As described above, in the liquid process apparatus 10a related to the second embodiment, the air hood 70 is fixed in position, and thus designed not to be lifted. More specifically, in this liquid process apparatus 10a related to the second embodiment, the air hood lifting mechanism 78 as shown in FIG. 7 is not provided.

Further, in the liquid process apparatus 10a related to the second embodiment, the outside cup peripheral case 50 is set higher then the outside cup peripheral case 50 provided in the liquid process apparatus 10 related to the first embodiment. In accordance with such configuration, the accumulation section 52a configured to accumulate therein the process liquid supplied in the cleaning unit 52 is arranged deeper.

Additionally, in the liquid process apparatus 10a related to the second embodiment, the outside cup peripheral case 50 is designed to move among the three positions, i.e., the first position as shown in FIG. 14, second position as shown in FIG. 15 and third position as shown in FIG. 16. For instance, when the outside cup peripheral case 50 is located in the first position as shown in FIG. 14, most of the outside cup peripheral case 50 is dipped in the cleaning liquid accumulated in the accumulation section 52a of the cleaning unit 52, and the wafer W held by the substrate holding unit 21 is laterally opened.

Meanwhile, when the outside cup peripheral case 50 is located in the second position as shown in FIG. 15, the tap end of the outside cup peripheral case 50 is positioned slightly higher than the top plate 32 located in the advanced position. Namely, when the outside cup peripheral case 50 is elevated from the first position to the second position after the top plate 32 is moved from the retracted position to the advanced position, the top plate 32 is contained in the outside cup peripheral case 50, with the top end or the outer-circumference cylinder 50 being positioned slightly higher than the top plate 32. Further, when the outside cup peripheral case 50 is located in the second position and when the top plate 32 is located in the advanced position, the space (i.e., the first process space) that is isolated from the exterior is formed around the wafer W by the top plate 32 and outside cup peripheral case 50. This space is used as the space in which the liquid process using the SPM liquid obtained by mixing the sulfuric acid with the aqueous hydrogen peroxide is provided to the wafer W. Namely, in this liquid process apparatus 10a related to the second embodiment, the process space is formed inside the top plate 32 and outside cup peripheral case 50 when the SPM process is performed for the wafer W. This configuration can prevent the atmosphere in the first process space from being leaked to the exterior as well as prevent the atmosphere of the exterior from entering the first process space. Further, due to the rotation of the top plate 32 in the horizontal plane, the droplets of the process liquid, such as the SPM liquid or the like, attached to the top plate 32 can be fed to the inner wall surface of the outside cup peripheral case 50 by the centrifugal force. As a result, such droplets will fall down, by the weight thereof, along the inner wall surface of the outside cup peripheral case 50, thereby to prevent the reattachment of the droplets of the process liquid, such as the SPM liquid or the like, to the wafer W.

Further, when the outside cup peripheral case 50 is located in the third position as shown in FIG. 16, the top end of the outside cup peripheral case 50 is brought in contact with or close to the bottom surface of the bottom plate 77 of the air hood 70. With this operation, the space (i.e., the second process space) that is isolated from the exterior is formed around the wafer W by the air hood 70 and outside cup peripheral case 50. This second process space is used as the space in which the purified gas is flowed downward from the air hood 70. Namely, in the liquid process apparatus 10a of this embodiment, the second process space is formed inside the air hood 70 and outside cup peripheral case 50, when the liquid process using the SC-1 liquid and/or drying process is performed for the wafer W. This configuration can prevent the atmosphere in the second process space from being leaked to the exterior as well as prevent the atmosphere of the exterior from entering the second process space. Further, since the second process space is formed into the closed space, the volume of the space in which the liquid process is performed can be substantially decreased. As such, the efficiency of each process can be improved. For instance, the efficiency of replacing the purified gas in the second process space can be enhanced.

Next, one exemplary series of steps in the cleaning process for removing the unnecessary resist film present on the top surface of the wafer W by using the liquid process apparatus 10a related to the second embodiment will be described. It is noted that such a series of steps in the cleaning process as will be exemplified below are respectively performed by controlling the operation of each functional part or the liquid process apparatus 10a by using the controller 200. Further, it is noted that the description on like operations respectively performed in the liquid process apparatus 10 related to the first embodiment will be omitted in the description for the liquid process apparatus 10a related to the second embodiment.

First, when the wafer W is carried into the liquid process apparatus 10a by the transfer arm 104 and then placed on the substrate holding unit 21, as shown in FIG. 14, the outside cup peripheral case 50 is located in the first position and the top plate 32 is located in the retracted position, with each nozzle support arm 82 being located in the retracted position that is retracted from the processing chamber 20. At this time, the gas, such as the clean air or the like, is always fed into the processing chamber 20, in the down flow manner, from the air hood 70, and then discharged from the processing chamber 20. Thus, appropriate replacement of the atmosphere in the processing chamber 20 can be performed.

Thereafter, when the SPM process is performed for the wafer W, as shown in FIG. 15, the top plate 32 is moved from the retracted position to the advanced position. Then, once the top plate 32 is moved to the advanced position, the rotation drive force is given to the top plate 32 by the servomotor 36. Thus, the top plate 32 is rotated in the horizontal plane about the rotation shaft 34. Further, once the top plate 32 is moved to the advanced position, the outside cup peripheral case 50 is elevated form the first position to the second position. With this operation, the space (i.e., the first process space) that is isolated from the exterior is formed around the wafer W by the top plate 32 and outside cup peripheral case 50.

After the outside cup peripheral case 50 is moved to the second position, the first nozzle support arm 82p of the four nozzle support arms 82 respectively waiting in the arm standby chamber 80 is advanced into the processing chamber 20 via the side opening 50m of the outside cup peripheral case 50. At this time, the holding plate 26 and lift pin plate 22 of the substrate holding unit 21 are rotated, respectively. Thus, the wafer W held by each holding member 25 of the holding plate 22 is also rotated. Then, the SPM liquid of the high temperature is supplied to the top surface of the wafer W from the nozzle 82a of the first nozzle support arm 82p advanced in the outside cup peripheral case 50, with the wafer W being rotated. In this way, the SPM process for the wafer W is performed.

Thereafter, when the SPM process for the wafer W is ended, the first nozzle support arm 82p advanced in the outside cup peripheral case 50 is retracted from the processing chamber 20 to wait in the arm standby chamber 80. During this operation, the wafer W and top plate 32 are kept to be rotated, respectively.

Subsequently, the third nozzle support arm 82r of the four nozzle support arms 82 respectively waiting in the arm standby chamber 80 is advanced into the processing chamber 20 via the side opening 50m of the outside cup peripheral case 50. Then, the heated pure water (e.g., the pure water of 80° C.) is supplied to the top surface of the wafer W from the nozzle 82a of the third nozzle support arm 82r advanced in the outside cup peripheral case 50, with the wafer W and top plate 32 being respectively rotated. Further, at this time, the heated pure water is supplied toward the bottom surface (or back surface) of the wafer W from the process liquid supply pipe 28. In this way, the hot rinse process is performed for the wafer W. It is noted that the intermediate process step as described in the above first embodiment is performed during the period of time between the SPM process for the wafer W and the hot rinse process for the wafer W.

Once the hot rinse process for the wafer W is ended, the third nozzle support arm 82r advanced in the outside cup peripheral case 50 is retracted from the outside cup peripheral case 50 to wait in the arm standby chamber 80. At this time, the wafer W is kept to be rotated. After the third nozzle support arm 82r is retracted from the outside cup peripheral case 50, the pure water is supplied toward the center of the wafer W by the fixed rinse nozzle 43.

Thereafter, the outside cup peripheral case 50 is lowered from the second position to the first position. At this time, the pure water is kept to be supplied toward the center of the wafer W by the fixed rinse nozzle 43. Once the outside cup peripheral case 50 is moved to the first position, the outside cup peripheral case 50 is dipped in the cleaning liquid accumulated in the accumulation section 52a of the cleaning unit 52. In this way, the cleaning process for the outside cup peripheral case 50 is performed. This cleaning process can prevent the droplets of the process liquid, such as the SPM liquid or the like scattered upon the SPM process for the wafer W, from remaining on the outside cup peripheral case 50. Thereafter, the top plate 32 is moved from the advanced position to the retracted position, and then stored in the top plate storage unit 38.

Then, the outside cup peripheral case 50 cleaned by the cleaning unit 52 is elevated from the first position to the third position as shown in FIG. 16. More specifically, the top end of the outer-circumference cylinder 50 is moved to be in contact with or close to the bottom surface of the bottom plate 77 of the air hood 70. Thus, the space (i.e., the second process space) that is isolated from the exterior is formed around the wafer W by the air hood 70 and outside cup peripheral case 50. During this operation, the pure water is kept to be supplied toward the center of the wafer W by the fixed rinse nozzle 43.

Then, the third nozzle support arm 82r of the four nozzle support arms 82 respectively waiting in the arm standby chamber 80 is advanced into the processing chamber 20 via the side opening 50m of the outside cup peripheral case 50. Thereafter, the SC-1 liquid is supplied to the top surface of the wafer W from the nozzle 82a of the third nozzle support arm 82r advanced in the outside cup peripheral case 50, with the wafer W being rotated as well as with the purified gas being flowed in the second process space from the air hood 70. Thus, the resist remaining on the surface of the wafer W can be removed.

Once the liquid process using the SC-1 liquid for the wafer W is ended, the third nozzle support arm 82r advanced in the outside cup peripheral case 50 is retracted from the outer-circumference cylinder 50 to wait in the arm standby chamber 80. After the third nozzle support arm 82r is retracted from the outside cup peripheral case 50, the purified gas is kept to be flowed in the second process space from the air hood 70. Then, the third nozzle support arm 82r of the four nozzle support arms 82 respectively waiting in the arm standby chamber 80 is advanced into the processing chamber 20 via the side opening 50m of the outside cup peripheral case 50. At this time, the third nozzle support arm 82r is moved linearly. Thereafter, the pure water of the normal temperature is supplied toward the center of the wafer W from the nozzle 82a of the third nozzle support arm 82r advanced in the outside cup peripheral case 50, with the wafer W and top plate 32 being rotated respectively. In this case, the pure water of the normal temperature is supplied toward the bottom surface for back surface) of the wafer W from the process liquid supply pipe 28. In this way, the rinse process for the wafer W is performed. Thereafter, the wafer W is rotated at the high speed to perform the drying process for the wafer W in the second process space.

After the liquid process using the SC-1 liquid and the rinse process of the normal temperature for the wafer W are respectively ended and the third nozzle support arm 82r is retracted from the outside cup peripheral case 50 and before the drying process for the wafer W is performed, the fourth nozzle support arm 82s may be advanced into the outside cup peripheral case 50, in order to perform the rinse process for the wafer W by spraying the droplets of the pure water toward the wafer W by using the two-fluid nozzle of the fourth nozzle support arm 82s. In this case, after the rinse process for the wafer W is ended and the fourth nozzle support arm 82s is retracted from the outside cup peripheral case 50, the purified gas is kept to be flowed in the second process space from the air hood 70. Thereafter, the wafer W is rotated at the high speed in order to perform the drying process for the wafer W in the second process space.

Once the drying process for the wafer W is ended, the outside cup peripheral case 50 is lowered from the third position to the first position, and thus the substrate holding unit 21 is laterally opened. Thereafter, the transfer arm 104 is advanced into the processing chamber 20 from the exterior of the liquid process apparatus 10a, and the wafer W held by the substrate holding unit 21 is transferred onto the transfer arm 104. Then, the wafer W taken out by the transfer arm 104 is carried to the exterior of the liquid process apparatus 10a. In this way, one series of steps in the liquid process for the wafer W are completed.

Next, the cleaning process for the top plate 32 will be described. Upon the cleaning process for the top plate 32, the top plate 32 is moved from the retracted position to the advanced position. After the top plate 32 is moved to the advanced position, the rotation drive force is given to the top plate 32 by the servomotor 36, and thus the top plate 32 is rotated in the horizontal plane about the rotation shaft 34. Then, the outside cup peripheral case 50 is elevated from the first position to the second position.

Once the outside cup peripheral case 50 is moved to the second position, the second nozzle support arm 82q of the four nozzle support arms 82 respectively waiting in the arm standby chamber 80 is advanced into the processing chamber 20 via the side opening 50m of the outside cup peripheral case 50. Thereafter, the top plate cleaning liquid, such as the pure water or the like, is discharged toward the top plate 32 from the nozzle 82a of the second nozzle support arm 82q advanced in the outside cup peripheral case 50, with the top plate 32 being rotated. Thus, the SPM liquid or the like liquid attached to the top plate 32 can be removed. When the cleaning process is performed for the top plate 32, the closed space is formed inside the top plate 32 and outside cup peripheral case 50. This closed space can serve to prevent the top plate cleaning liquid discharged from the nozzle 82a of the second nozzle support arm 82q from being leaked to the outside of the outside cup peripheral case 50.

It should be appreciated that the liquid process apparatus according to this embodiment is not limited to the aspect as described above, and it should be construed that various modifications can be made thereto.

Figure 17:
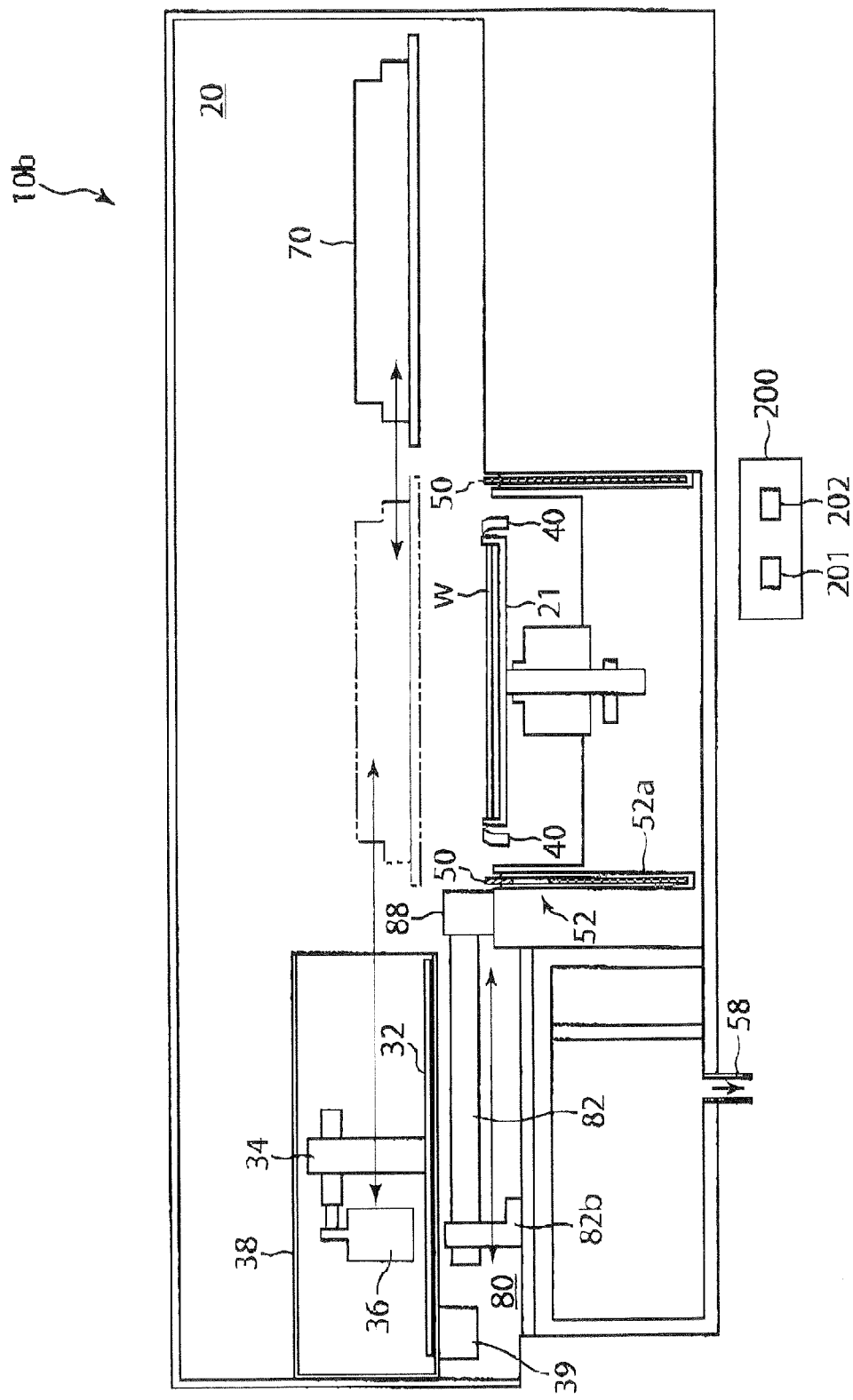
FIG. 17 is a side view for illustrating one variation of the liquid process apparatus related to the second embodiment of the present invention.

Now, referring to FIG. 17, one variation of the liquid process apparatus related to the second embodiment will be described. For instance, in the liquid process apparatus 10b of the variation as shown in FIG. 17, the air hood 70 may be moved, rather than fixed in position, in the horizontal direction between an advanced position (see a two-dot chain line depicted in FIG. 17), in which the air hood 70 covers, from above, the wafer W held by the substrate holding unit 21, and a retracted position (see a solid line depicted in FIG. 17), in which the air hood 70 is retracted in horizontal direction from the advanced position. In this case, the outside cup peripheral case 50 moves between the first position, in which the most part of the outside cup peripheral case 50 is dipped in the cleaning liquid accumulated in the accumulation section 52a of the cleaning unit 52, and the second position, in which the top end of the outside cup peripheral case 50 is positioned slightly higher than the top plate 32 located in the advanced position. Further, in this case, when the outside cup peripheral case 50 is located in the second position and when the air hood 70 is located in the advanced position, the top end of the outside cup peripheral case 50 is brought in contact with or close to the bottom surface of the air hood 70. Thus, the space (i.e., the second process space) that is isolated from the exterior is formed around the wafer W by the air hood 70 and outside cup peripheral case 50. This space is used as the space in which the purified gas is flowed downward from the air hood 70. Namely, also in the liquid process apparatus 10b of the variation as shown in FIG. 17, when the liquid process using the SC-1 liquid and/or drying process is performed for the wafer W, the second process space formed inside the air hood 70 and outside cup peripheral case 50 can serve to prevent the atmosphere in the second process space from being leaked to the exterior as well as prevent the atmosphere of the exterior from entering into the second process space. Further, since the second process space is formed into the closed space, the volume of the space in which the liquid process is performed can be substantially decreased. As such, the process efficiency, e.g., the efficiency of replacing the purified gas, in the second process space, can be significantly enhanced.

As in the liquid process apparatus 10 related to the first embodiment, the liquid process apparatus ba related to the second embodiment may include the LED lamp 33, as shown in FIG. 12A, that is provided to the top plate holding arm 35 and used as the top plate heating mechanism for heating the top plate 32. In this case, the top plate 32 is provided to be rotated, while the LED lamp 33 is provided not to be rotated. As described above, when the SPM liquid is discharged to the top surface of the wafer W in order to remove the resist film provided on the top surface of the wafer W, the ability of the SPM liquid to remove the resist film can be enhanced as the temperature of the SPM liquid is elevated. Therefore, by providing the LED lamp 33 in the vicinity of the top plate 32 and heating the top plate 32 by using the LED lamp 33, the atmosphere around the wafer W held by the substrate holding unit 21 can also be heated, thereby to heat the SPM liquid discharged onto the top surface of the wafer W. As such, the ability of the SPM liquid to remove the resist film can be enhanced. Further, even in the case in which the SPM liquid is attached to the bottom surface of the top plate 32, this SPM liquid can be vaporized by the LED lamp 33.

Further, as in the liquid process apparatus 10 related to the first embodiment, the liquid process apparatus 10a related to the second embodiment may include the top plate cleaning mechanism 38a, as shown in FIG. 13, that is provided in the top plate storage unit 38 and configured to clean the top plate 32 stored in the storage unit 38.

Furthermore, as in the liquid process apparatus 10 related to the first embodiment, the liquid process apparatus 10a related to the second embodiment may be configured such that a suitable process liquid supply nozzle configured to supply the SPM liquid to the wafer W is provided to the bottom surface of the top plate 32, rather than configured such that each nozzle support arm 62 supporting the four nozzles 82a is moved in the horizontal direction between the advanced position located in the outside cup peripheral case 50 and the retracted position that is retracted from the advanced position. In this case, the provision of each nozzle 82a for supplying the SPM liquid and provision of the nozzle support arm 82 for supporting each nozzle 82a can be omitted.

Third Embodiment

Figure 18:
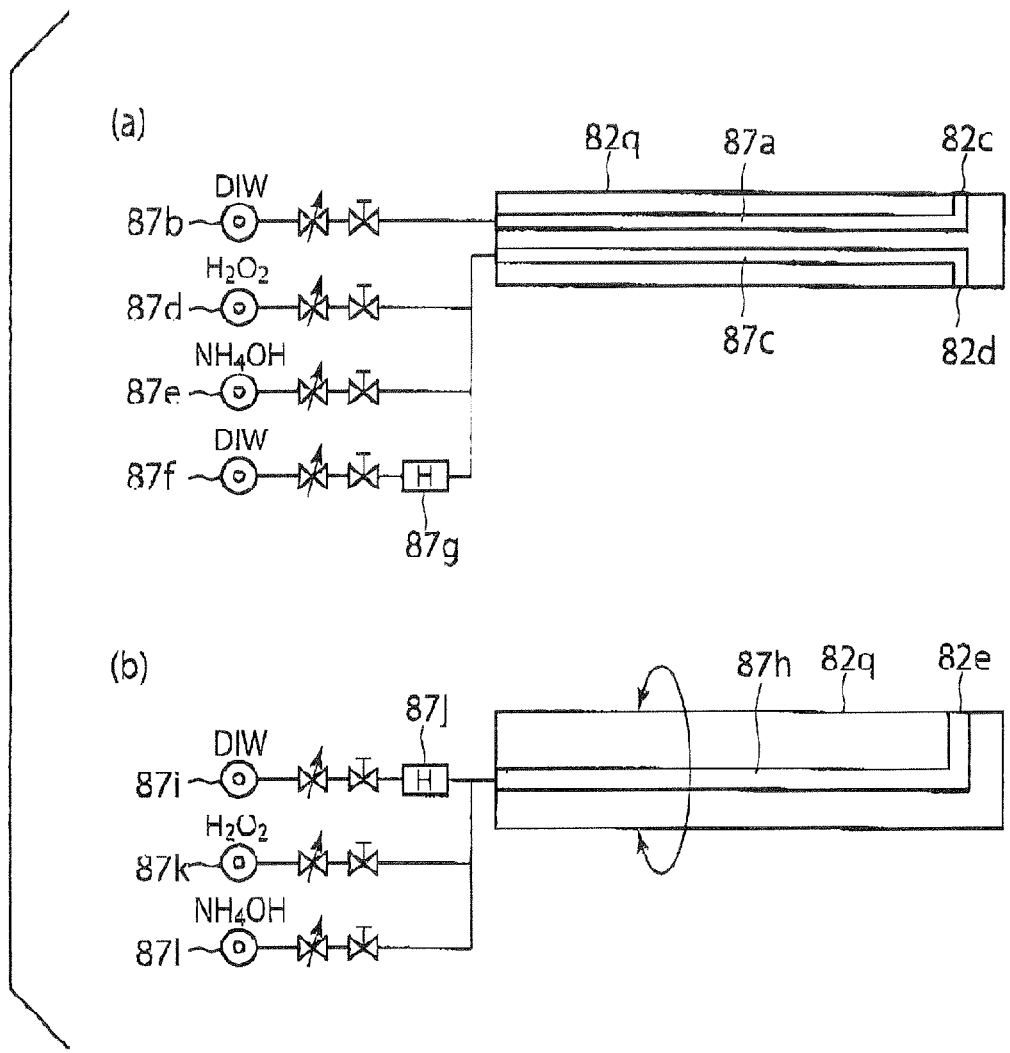
FIGS. 18(a) and 18(b) are diagrams respectively provided for illustrating each nozzle and each nozzle support arm respectively provided in the liquid process apparatus related to a third embodiment.

Now, referring to FIG. 18, the liquid process apparatus related to the third embodiment of the present invention will be described. In the liquid process apparatus related to the third embodiment, as compared with the liquid process apparatus related to the first embodiment, one nozzle configured to discharge upward the top plate cleaning liquid, such as the pure water or the like, and another nozzle configured to discharge downward the SC-1 liquid and/or heated pure water are supported together by one nozzle support arm. Hereinafter, the description on like parts respectively provided in the liquid process apparatus related to the first embodiment will be omitted in the description for the liquid process apparatus related to the third embodiment.

As compared with the four nozzle support arms 82p to 82s of the liquid process apparatus 10 related to the first embodiment as shown in FIGS. 8(a) to 8(d), the liquid process apparatus related to the third embodiment as shown in FIG. 18(a) includes two nozzles, i.e., an upward-facing nozzle 82c and a downward-facing nozzle 82d. In this embodiment, the upward-facing nozzle 82c is configured to discharge upward the top plate cleaning liquid for cleaning the top plate 32, and the downward-facing nozzle 82d is configured to discharge downward the SC-1 liquid and/or heated pure water. Further, in the liquid process apparatus related to the third embodiment, the provision of the third nozzle support arm 82r as arranged in the liquid process apparatus 10 related to the first embodiment can be omitted.

More specifically, in the second nozzle support arm 82q, one top plate cleaning liquid supply pipe 87a is provided to be connected with the upward-facing nozzle 82c, and one top plate cleaning liquid supply unit 87b is connected with the top plate liquid supply pipe 87a, via the flow control valve and open-and-close valve. With this configuration, the top plate cleaning liquid, such as the pure water or the like, supplied from the top plate cleaning liquid supply unit 87b can be fed to the upward-facing nozzle 82c via the top plate cleaning liquid supply pipe 87a.

Further, in the second nozzle support arm 82q, one process liquid supply pipe 87c is provided to be connected with the downward-facing nozzle 82d, and the aqueous hydrogen peroxide supply unit 87d, aqueous ammonia supply unit 87e and pure water supply unit 87f, which are arranged in parallel with one another, are connected, respectively, with the process liquid supply pipe 87c, via the now control valves and open-and-close valves. In addition, one heater 87g configured to heat the pure water supplied from the pure water supply unit 87f is provided. For instance, in the state in which the open-and-close valve corresponding to the pure water supply unit 87f is closed, the SC-1 liquid is prepared by mixing the aqueous hydrogen peroxide and aqueous ammonia, respectively supplied from the aqueous hydrogen peroxide supply unit 87d and aqueous ammonia supply unit 87e, and then the prepared SC-1 liquid is fed to the downward-facing nozzle 82d via the process liquid supply pipe 87c. Alternatively, in the state in which the open-and-close valves, respectively corresponding to the aqueous hydrogen peroxide supply unit 87d and aqueous ammonia supply unit 87e, are closed, the pure water supplied from the pure water supply unit 87F is heated by the heater 87g, and then the heated pure water can be fed to the downward-facing nozzle 82d via the process liquid supply pipe 87c.

As described above, in the example as shown in FIG. 18(a), the nozzle support arm 82q is provided for supporting the upward-facing nozzle (or top-plate cleaning liquid supply nozzle) 82c configured to supply the top plate cleaning liquid, such as the pure water or the like, from below, to the bottom surface of the top plate 32, as well as provided for supporting the nozzle (or process liquid supply nozzle) 82d configured to supply the process liquid used for the wafer W, from above, to the wafer W held by the substrate holding unit 21. In this case, when the nozzle 82d configured to supply the process liquid to the wafer W is directed downward, the nozzle 82c configured to supply the top plate cleaning liquid to the top plate 32 is directed upward. With this configuration, when the nozzle support arm 82q is advanced into the outside cup peripheral case 50, the step of supplying the top plate cleaning liquid (e.g., the pure water), from below, to the bottom surface of the top plate 32 by using the upward-facing nozzle 82c and the step of supplying the process liquid used for the wafer W (e.g., the heated pure water), from above, to the wafer W by using the downward-facing nozzle 80d can be performed at the same time.

In another variation, as shown in FIG. 18(b), the second nozzle support arm 82q may be rotated about the longitudinal axis of the second nozzle support arm 82q. In this case, when one nozzle 82e provided to the second nozzle support arm 82q is directed upward, the top plate cleaning liquid can be supplied, from below, to the bottom surface or the top plate 32. Meanwhile, when the nozzle 82e is directed downward, the process liquid used for the wafer W can be supplied, from above, to the wafer W. In this case, the provision of the third nozzle support arm 82r as provided in the liquid process apparatus 10 related to the first embodiment can be omitted.

More specifically, in the second nozzle support arm 82q, one process liquid supply pipe 87h is provided to be connected with the nozzle 82e, and the pure water supply unit 87i, aqueous hydrogen peroxide supply unit 87k and aqueous ammonia supply unit 87l, which are arranged in parallel with one another, are connected, respectively, with the process liquid supply pipe 87h, via the flow control valves and open-and-close valves. In addition, one heater 87j configured to heat the pure water supplied from the pure water supply unit 87l is provided. For instance, in the state in which the open-and-close valve corresponding to the pure water supply unit 87i is closed, the SC-1 liquid is prepared by mixing the aqueous hydrogen peroxide and aqueous ammonia, respectively supplied from the aqueous hydrogen peroxide supply unit 87k and aqueous ammonia supply unit 87l, and then the SC-1 liquid is fed, as the process liquid for the wafer W, to the nozzle 82e via the process liquid supply pipe 87h. Alternatively, in the state in which the open-and-close valves, respectively corresponding to the aqueous hydrogen peroxide supply unit 87k and aqueous ammonia supply unit 87l, are closed, the pure water supplied from the pure water supply unit 87*i* can be fed, as the top plate cleaning liquid for cleaning the top plate 32, to the nozzle 82*e*. In addition, the pure water supplied from the pure water supply unit 87*i* can be heated by the heater 87*j*, and then the heated pure water can be fed, as the process liquid for the wafer W, to the nozzle 82*e* via the process liquid supply pipe 81*h*.

As described above, in the example as shown in FIG. 18(*b*), the nozzle support arm 82*q* can be rotated about the longitudinal axis of the nozzle support arm 82*q*. Thus, when the nozzle 82*e* is directed upward by the rotation of the second nozzle support arm 82*q*, the nozzle 82*e* can serve to supply the top plate cleaning liquid, such as the pure water or the like, to the top plate 32. Meanwhile, when the nozzle 82*e* is directed downward, this nozzle step can serve to supply the process liquid used for the wafer W, from above, to the wafer W held by the substrate holding unit 21. With this configuration, once the step for supplying the process liquid used for the wafer W the SC-1 liquid and/or heated pure water), from above, to the wafer W by using the nozzle 82*e* of the nozzle support arm 82*q* is performed, the nozzle 82*e* is directed upward by the rotation of the nozzle support arm 82*q*, thereby to perform the step for supplying the top plate cleaning liquid (e.g., the pure water), from below, to the bottom surface of the top plate 32 by using the nozzle 82*e*.

As described above, in the SPM process performed in a usual liquid process apparatus, the SPM liquid heated to a considerably high temperature is discharged toward the wafer. Therefore, the SPM liquid is likely to be vaporized and thus generate the fumes. In this case, such fumes tend to be spread widely in the processing chamber of the resist removing apparatus, thus leading to the contamination of the inner wall of the processing chamber and parts provided in the processing chamber. In addition, such fumes may cause the contamination of the wafer. However, it should be noted that such a problem may also be caused by any other chemical liquid than the SPM liquid.

The invention claimed is:

1. A liquid process apparatus comprising:
   a substrate holding unit configured to hold a substrate in a horizontal direction;
   a nozzle configured to supply a process liquid to the substrate held by the substrate holding unit;
   a cup located radially outside around the substrate when the substrate is held by the substrate holding unit, and configured to receive the process liquid supplied to the substrate by the nozzle;
   a top plate that moves in the horizontal direction between an advanced position, in which the top plate covers, from above, the substrate held by the substrate holding unit, and a retracted position, in which the top plate is retracted from the advanced position; and
   an air hood configured to supply a purified gas downward and move in the vertical direction between an air hood lower position, in which the air hood covers, from above, the substrate held by the substrate holding unit, and an air hood upper position located above the air hood lower position.

2. The liquid process apparatus according to claim 1, further comprising: an outside cup peripheral case disposed around the cup and configured to move between a cup upper position, in which a top end of the outside cup peripheral case is positioned above the cup, and a cup lower position located below the cup upper position, a top opening being provided to the top of the outside cup peripheral case, wherein
   when the outside cup peripheral case is located in the cup upper position and when the air hood is located in the air hood lower position, a space, in which the purified gas is supplied, is formed in the outside cup peripheral case.

3. The liquid process apparatus according to claim 2, wherein when the outside cup peripheral case is located in the cup upper position and when the top plate is located in the advanced position, the space used for performing a liquid process for the substrate is formed in the outside cup peripheral case.

4. The liquid process apparatus according to claim 2, wherein
   a side opening is formed in a side surface of the outside cup peripheral case; and
   a nozzle support arm configured to support the nozzle and move in the horizontal direction between an advanced position, in which the nozzle support arm is advanced in the outside cup peripheral case via the side opening formed in the side surface of the outside cup peripheral case when the outside cup peripheral case is located in the cup upper position, and a retracted position, in which the nozzle support arm is retracted outward from the outside cup peripheral case.

5. The liquid process apparatus according to claim 2, further comprising: a cleaning unit including an accumulation section that accumulates a cleaning liquid and configured to clean the outside cup peripheral case, wherein
   the outside cup peripheral case is dipped in the cleaning liquid accumulated in the accumulation section, when the outside cup peripheral case is located in the cup lower position; and
   the outside cup peripheral case is cleaned by the cleaning unit when the outside cup peripheral case is moved from the cup upper position to the cup lower position during a period of time after the process liquid is supplied by the nozzle to the substrate held by the substrate holding unit and before the space in which the gas is supplied by the air hood is formed in the outside cup peripheral case.

6. The liquid process apparatus according to claim 1, wherein a top plate rotation mechanism is installed on the top plate and configured to rotate the top plate in a horizontal plane.

7. The liquid process apparatus according to claim 1, further comprising: a top plate heating mechanism that heats the top plate.

8. The liquid process apparatus according to claim 1, further comprising:
   a top plate holding arm configured to hold the top plate; and
   a shaft installed to a proximal end of the top plate holding arm, wherein
   the top plate moves between the advanced position and the retracted position, with rotation of the top plate holding arm about the shaft.

9. The liquid process apparatus according to claim 1, further comprising: a top plate storage unit configured to store the top plate when the top plate is retracted to the retracted position.

10. The liquid process apparatus according to claim 9, wherein a top plate cleaning mechanism is installed to the top plate storage unit and configured to clean the top plate stored in the top plate storage unit.

11. The liquid process apparatus according to claim 1, wherein the process liquid supplied by the nozzle is a mixture of sulfuric acid and aqueous hydrogen peroxide.

12. The liquid process apparatus according to claim 1, wherein after the process liquid is supplied by the nozzle to the substrate held by the substrate holding unit and after the air hood is moved to the air hood lower position, an additional liquid process is performed for the substrate by another process liquid of a temperature lower than the temperature of said process liquid, with the purified gas being supplied downward from the air hood.

13. The liquid process apparatus according to claim 12, wherein the process liquid of the lower temperature is a mixture of aqueous ammonia and aqueous hydrogen peroxide.

* * * * *